United States Patent
Kanakamedala et al.

(10) Patent No.: US 9,824,966 B1
(45) Date of Patent: Nov. 21, 2017

(54) THREE-DIMENSIONAL MEMORY DEVICE CONTAINING A LATERAL SOURCE CONTACT AND METHOD OF MAKING THE SAME

(71) Applicant: SANDISK TECHNOLOGIES LLC, Plano, TX (US)

(72) Inventors: Senaka Kanakamedala, Milpitas, CA (US); Raghuveer S. Makala, Campbell, CA (US); Yanli Zhang, San Jose, CA (US); Rahul Sharangpani, Fremont, CA (US); James Kai, Santa Clara, CA (US); Yao-Sheng Lee, Tampa, FL (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 15/235,864

(22) Filed: Aug. 12, 2016

(51) Int. Cl.
*H01L 29/74* (2006.01)
*H01L 29/76* (2006.01)
(Continued)

(52) U.S. Cl.
CPC .... *H01L 23/5226* (2013.01); *H01L 21/76816* (2013.01); *H01L 21/76843* (2013.01);
(Continued)

(58) Field of Classification Search
CPC ......... H01L 27/10841; H01L 27/11524; H01L 27/11556; H01L 27/1157; H01L 27/11582;
(Continued)

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

| JP | 2015149413 A | 8/2015 |
| WO | WO02/15277 A2 | 2/2002 |
| WO | 2016093947 A1 | 6/2016 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Hsien Ming Lee
(74) *Attorney, Agent, or Firm* — The Marbury Law Group PLLC

(57) ABSTRACT

A sacrificial film and an alternating stack of insulating layers and sacrificial material layers are sequentially formed over a substrate. A memory stack structure including a memory film and a vertical semiconductor channel is formed through the alternating stack and the sacrificial film on the substrate. A source level cavity is formed by introducing an etchant or a reactant through a backside trench and removing the sacrificial film. After removal of an annular portion of the memory film, a portion of the vertical semiconductor channel is converted into an annular source region by introducing electrical dopants into the channel. A source contact layer is formed in the source level cavity and directly on the annular source region. The sacrificial material layers are replaced with electrically conductive layers. The annular source region and the source contact layer can provide low source contact resistance in a three-dimensional NAND memory device.

18 Claims, 23 Drawing Sheets

(51) Int. Cl.
*H01L 21/00* (2006.01)
*H01L 21/337* (2006.01)
*H01L 21/8238* (2006.01)
*H01L 21/8236* (2006.01)
*H01L 23/522* (2006.01)
*H01L 27/1157* (2017.01)
*H01L 27/11582* (2017.01)
*H01L 27/11573* (2017.01)
*H01L 23/532* (2006.01)
*H01L 23/528* (2006.01)
*H01L 21/768* (2006.01)

(52) U.S. Cl.
CPC .... *H01L 21/76877* (2013.01); *H01L 23/5283* (2013.01); *H01L 23/53266* (2013.01); *H01L 27/1157* (2013.01); *H01L 27/11573* (2013.01); *H01L 27/11582* (2013.01)

(58) Field of Classification Search
CPC ..... H01L 21/823431; H01L 21/823487; H01L 21/823821; H01L 21/823885; H01L 29/4236; H01L 29/66666; H01L 29/7788; H01L 29/7827; H01L 29/785; H01L 29/78642
USPC ........ 257/220, 263, 328, 330, 331; 438/156, 438/173, 192, 212, 268
See application file for complete search history.

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,696,559 | B2 | 4/2010 | Arai et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,349,681 | B2 | 1/2013 | Alsmeier et al. |
| 8,394,716 | B2 | 3/2013 | Hwang et al. |
| 8,878,278 | B2 | 11/2014 | Alsmeier et al. |
| 9,305,932 | B2 | 4/2016 | Kanakamedala et al. |
| 9,355,127 | B2 | 5/2016 | Zhang et al. |
| 2007/0210338 | A1 | 9/2007 | Orlowski |
| 2007/0252201 | A1 | 11/2007 | Kito et al. |
| 2009/0230449 | A1 | 9/2009 | Sakaguchi et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0119287 | A1 | 5/2012 | Park et al. |
| 2012/0199897 | A1 | 8/2012 | Chang et al. |
| 2012/0273872 | A1 | 11/2012 | Lim et al. |
| 2013/0214344 | A1 | 8/2013 | Lim et al. |
| 2013/0248974 | A1 | 9/2013 | Alsmeier et al. |
| 2013/0264631 | A1 | 10/2013 | Alsmeier et al. |
| 2015/0149413 | A1 | 5/2015 | Lee et al. |
| 2015/0179660 | A1 | 6/2015 | Yada et al. |
| 2015/0348984 | A1 | 12/2015 | Yada et al. |
| 2015/0380418 | A1 | 12/2015 | Zhang et al. |
| 2016/0163729 | A1* | 6/2016 | Zhang ............... H01L 27/11582 257/321 |
| 2016/0233227 | A1 | 8/2016 | Zhang et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

M.Bauer et al., "Low temperature catalyst enhanced etch process with high etch rate selectivity for amorphous silicon based alloys over single-crystalline silicon based alloys," Sci Verse ScienceDirect-Thin Solid Firms—2011 Elsevier BV, www.elsevier.com/locate/tsf, Dec. 13, 2011, 5 pgs. Phoenix—AZ—USA.

International Search Report for International Application No. PCT/US2015/035779, dated Nov. 23, 2015, 6 pages.

Written Opinion of the International Searching Authority for International Application No. PCT/US2015/035779, dated Nov. 23, 2015, 13 pages.

U.S. Appl. No. 15/017,961, filed Feb. 8, 2016, SanDisk Technologies Inc.

U.S. Appl. No. 15/225,492, filed Aug. 1, 2016, SanDisk Technologies LLC.

International Application No. PCT/US2017/034466, Invitation to Pay Additional Fees, issued Sep. 20, 2017, 14pgs.

* cited by examiner

THREE-DIMENSIONAL MEMORY DEVICE CONTAINING A LATERAL SOURCE CONTACT AND METHOD OF MAKING THE SAME

FIELD

The present disclosure relates generally to the field of semiconductor devices and specifically to three-dimensional memory structures, such as vertical NAND strings and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises a semiconductor substrate, an alternating stack of insulating layers and electrically conductive layers located over the semiconductor substrate, a memory stack structure extending through the alternating stack and comprising a memory film and a vertical semiconductor channel, and an annular source region of a first conductivity type contacting a bottom end of the vertical semiconductor channel. The device further comprises a doped semiconductor well of the first conductivity type located within the semiconductor substrate, a source contact layer comprising a metal or metal alloy located between the alternating stack and the semiconductor substrate, and contacting an outer sidewall of the annular source region, an annular bottom surface of the memory film, and a top surface of the doped semiconductor well, a backside contact trench extending through the alternating stack, an insulating spacer located at a periphery of the backside trench, and a backside contact via structure located within the insulating spacer. The backside contact via structure is separated from the source contact layer by the insulating spacer, such that the backside contact via structure does not directly physically contact the source contact layer. The backside contact via structure is electrically connected to the source contact layer through the doped semiconductor well located in the semiconductor substrate.

According to another aspect of the present disclosure, a method of forming a three-dimensional memory device comprises forming a sacrificial film on a semiconductor substrate, forming an alternating stack of insulating layers and sacrificial material layers over the sacrificial film, forming a memory stack structure through the alternating stack, wherein the memory stack structure comprises a memory film and a vertical semiconductor channel, forming a backside trench through the alternating stack, and forming a source level cavity by introducing an etchant or a reactant through the backside trench and removing the sacrificial film selective to the alternating stack and to the semiconductor substrate. The method further comprises removing an annular portion of the memory film to form an annular cavity, introducing electrical dopants through the source level cavity and the annular cavity to form an annular source region in a portion of the vertical semiconductor channel and a doped semiconductor well in an upper portion of the semiconductor substrate, forming a source contact layer comprising a metal or metal alloy in the source level cavity and directly on the annular source region, replacing the sacrificial material layers with electrically conductive layers, forming an insulating spacer on the source contact layer and the electrically conductive layers at a periphery of the backside trench, and forming a backside contact via structure within the insulating spacer such that the backside contact via structure does not directly physically contact the source contact layer.

According to another aspect of the present disclosure, a method of forming a three-dimensional memory device comprises forming a sacrificial film on a substrate, forming an alternating stack of insulating layers and sacrificial material layers over the sacrificial film, forming a memory stack structure through the alternating stack, wherein the memory stack structure comprises a memory film and a vertical semiconductor channel, forming a backside trench through the alternating stack, and forming a source level cavity by introducing an etchant or a reactant through the backside trench and removing the sacrificial film selective to the alternating stack and to the substrate. The method further comprises removing an annular portion of the memory film to form an annular cavity, converting a portion of the vertical semiconductor channel into an annular source region by introducing electrical dopants through the source level cavity and the annular cavity into the portion of the vertical semiconductor channel, epitaxially growing a single crystal semiconductor source contact layer in the source level cavity and directly on the annular source region, and replacing the sacrificial material layers with electrically conductive layers.

DETAILED DESCRIPTION

As discussed above, the present disclosure is directed to three-dimensional memory structures, such as vertical NAND strings, that include a back gate electrode, and methods of making thereof, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Figure 1:
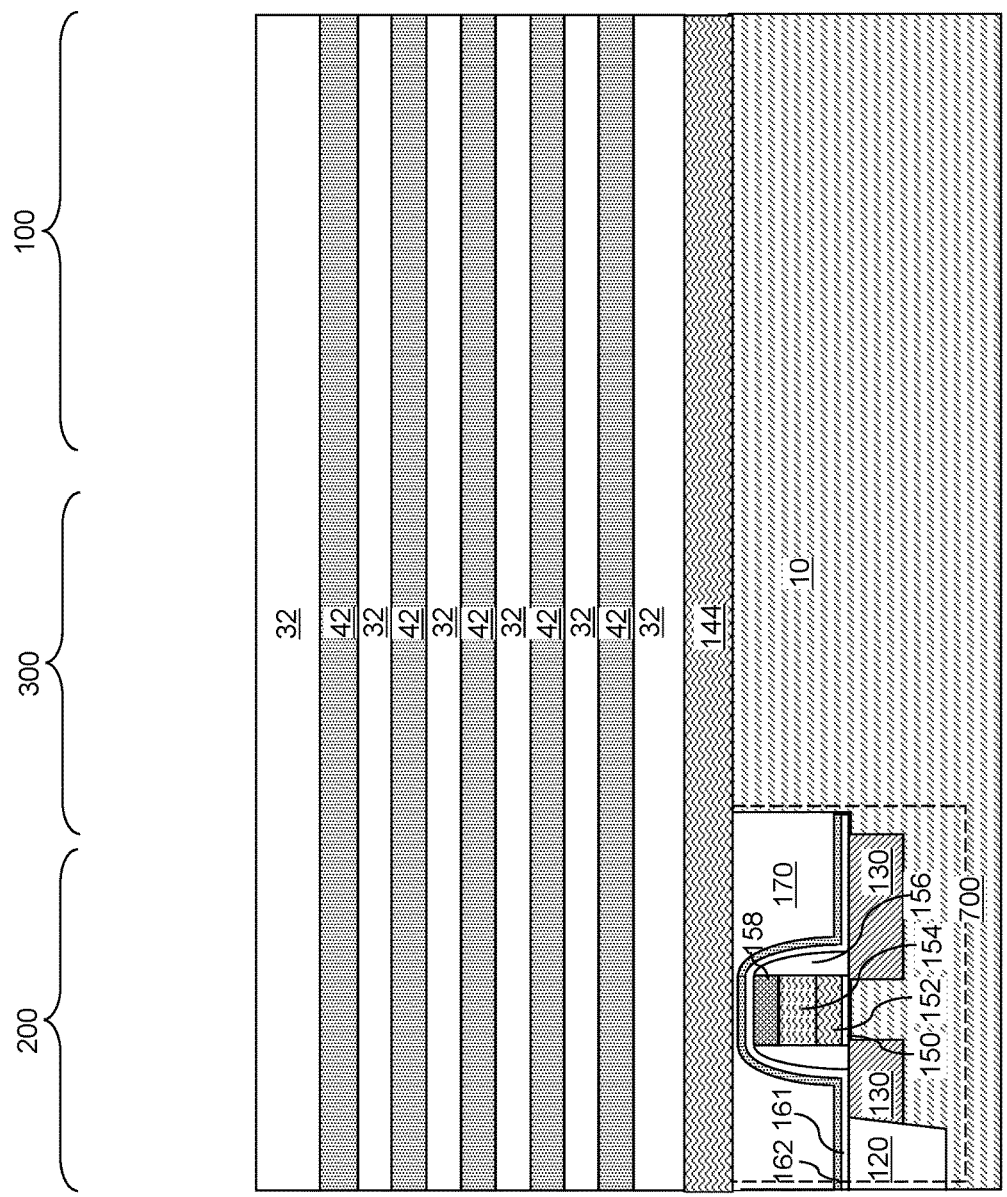
FIG. 1 is a vertical cross-sectional view of a first exemplary structure after formation of at least one peripheral device, a sacrificial film, and a stack of alternating plurality of first material layers and second material layers according to a first embodiment of the present disclosure.

Referring to FIG. 1, a first exemplary structure according to a first embodiment of the present disclosure is illustrated, which can be employed, for example, to fabricate a device structure containing vertical NAND memory devices. The exemplary structure includes a substrate 10, which can be a semiconductor substrate. The substrate 10 can include a semiconductor material layer, and can include at least one elemental semiconductor material (e.g., silicon), at least one III-V compound semiconductor material, at least one II-VI compound semiconductor material, at least one organic semiconductor material, or other semiconductor materials known in the art. For example, the substrate 10 may be a single crystal silicon wafer having a doped (e.g., p-type doped) well and/or layer at its upper surface. The substrate can have a major surface, which can be, for example, a topmost surface of the semiconductor material layer. The major surface can be a semiconductor surface. In one embodiment, the major surface can be a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate 10. The at least one semiconductor device can include, for example, field effect transistors. For example, at least one shallow trench isolation structure 120 can be formed by etching portions of the substrate 10 and depositing a dielectric material therein. A gate dielectric layer, at least one gate conductor layer, and a gate cap dielectric layer can be formed over the substrate 10, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate 10, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device. The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

A sacrificial film 144 can be formed over the substrate 10. The sacrificial film 144 includes a sacrificial material. As used herein, a "sacrificial material" refers to a material this is removed in a subsequent processing step. The sacrificial material can be any material that can be removed selective to the materials of the substrate 10, the planarization dielectric layer 170, and an alternating stack of insulating layers and sacrificial material layers to be subsequently formed. The sacrificial material of the sacrificial film 144 can be, for example, a semiconductor material such as amorphous silicon, amorphous silicon carbide, amorphous silicon carbide phosphide, germanium, a silicon-germanium alloy, a compound semiconductor material, or an organic semiconductor material that is different in composition from the substrate 10. Alternatively, the sacrificial material of the sacrificial film 144 can include a dielectric material such as organosilicate glass, doped silicate glass (e.g., BSG, PSG or BPSG), amorphous carbon, diamond-like carbon (DLC), a silicon-based polymer, or porous derivatives thereof. Alternatively, the sacrificial film 144 may comprise silicon oxide which is formed by a different method from the silicon oxide of the insulating material layers 32 formed over the sacrificial film, which leads to a different etch rate between film 144 and the insulating layers 32. Silicon oxide materials that may be used include, but are not limited to, dichlorosilane (DCS, $H_2SiCl_2$) based silicon oxides, disilane (DS, $Si_2H_6$) based silicon oxides, high aspect ratio process (HARP) non-plasma based CVD using TEOS and ozone sources based silicon oxides, high density plasma (HDP) CVD based silicon oxides, tetraethyl orthosilicate (TEOS) based silicon oxides.

A stack of an alternating plurality of first material layers 32 and second material layers 42 is formed over the top surface of the substrate 10, which can be, for example, over the sacrificial film 144. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers. In one embodiment, the alternating plurality of first material layers and second material layers may end with an instance of the first material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer 32 can be an insulating layer, and each second material layer 42 can be a sacrificial material layer.

In this case, the stack can include an alternating plurality of first material layers 32 and second material layers 42.

The stack of the alternating plurality is herein referred to as an alternating stack (32, 42). Each first material layer 32 can be composed of the first material, and each second material layer 42 can be composed a second material different from the first material. The first material of the first material layers 32 can be at least one electrically insulating material. In other words, the first material can be an insulating material, and each first material layer 32 can be an insulating layer. As such, each first material layer 32 can be an electrically insulating material layer. Electrically insulating materials that can be employed for the first material layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first material layers 32 can be silicon oxide.

In one embodiment, the second material of the second material layers 42 is a sacrificial material that can be removed selective to the first material of the first material layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In this case, the second material layers 42 may comprise an electrically insulating material, a semiconductor material, or a conductive material. The second material of the second material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the second material layers 42 can be material layers that comprise silicon nitride or a semiconductor material including at least one of silicon and germanium.

In one embodiment, the first material layers 32 can include silicon oxide, and the sacrificial material layers can include silicon nitride sacrificial material layers. The first material of the first material layers 32 can be deposited, for example, by chemical vapor deposition (CVD). For example, if silicon oxide is employed for the first material layers 32, tetraethyl orthosilicate (TEOS) can be employed as the precursor material for the CVD process. The second material of the second material layers 42 can be formed, for example, CVD or atomic layer deposition (ALD).

Alternatively, the second material of the second material layers 42 can be a permanent conductive material, i.e., a conductive material that is not subsequently replaced with any other material. In this case, the second material layers 42 can be conductive material layers. Exemplary conductive materials that can be employed as the second material include, but are not limited to, a conductive metallic nitride material (such as TiN, TaN, and WN), an elemental metal or an alloy thereof (such as W, Cu, Al, and alloys thereof), a doped semiconductor material, or a combination thereof.

The thicknesses of the first material layers 32 and the second material layers 42 can be in a range from 20 nm to 50 nm, although lesser and greater thicknesses can be employed for each first material layer 32 and for each second material layer 42. The number of repetitions of the pairs of a first material layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each second material layer 42 in the alternating stack (32, 42) can have a uniform thickness that is substantially invariant within the respective second material layer 42.

In one embodiment, a bottommost insulating layer 32 of the alternating stack (32, 42) can contact the top surface of the sacrificial film 144. In other words, the bottommost layer within the alternating stack (32, 42) can be an insulating layer 32. In one embodiment, the topmost layer within the alternating stack (32, 42) can be an insulating layer 32. The topmost insulating layer 32 may have a greater thickness than underlying insulating layers 32.

The first exemplary structure includes a memory array region 100 in which a memory array is to be subsequently formed, a peripheral device region 200 in which at least one semiconductor device (which can include a driver circuitry for the memory array to be subsequently form the in the memory array region 100), and a contact region 300 in which a terrace region and word line contact via structures are to be subsequently formed.

Figure 2:
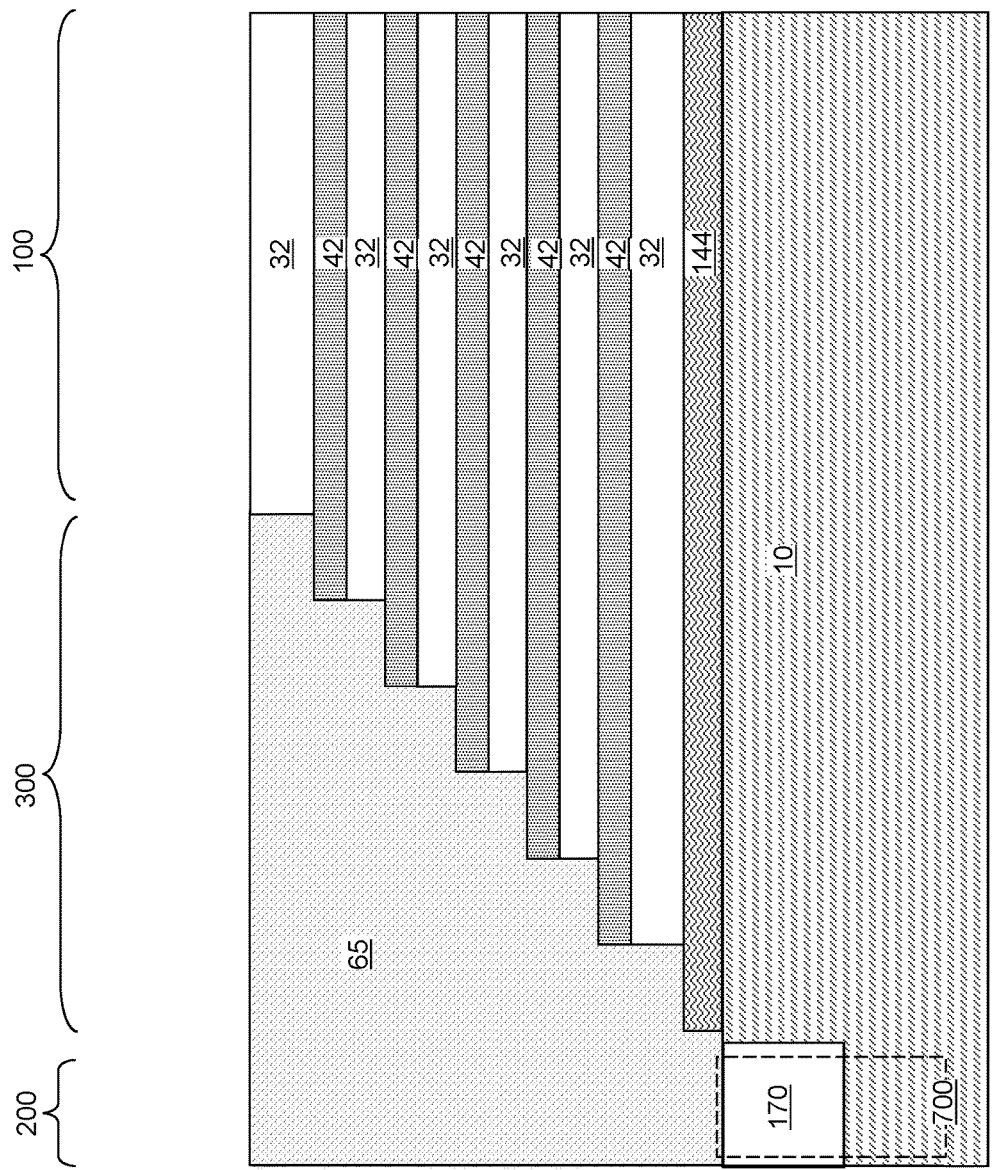
FIG. 2 is a vertical cross-sectional view of the first exemplary structure after formation of a terrace region and a retro-stepped dielectric material portion according to the first embodiment of the present disclosure.

Referring to FIG. 2, a stepped cavity can be formed within the contact region 300 which is located between the memory array region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than the topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42). Optionally, stepped surfaces can be formed on the sacrificial film 144. The sacrificial film 144 laterally extends at least as far as the bottommost layer within the alternating stack (32, 42), and may laterally extend farther than the bottommost layer within the alternating stack (32, 42). In one embodiment, the sacrificial film 144 laterally extends at least as far as the bottommost sacrificial material layer 42 within the alternating stack (32, 42) after formation of the terrace region. In one embodiment, a top surface of the planarization dielectric layer 170 can be physically exposed at the bottom of the stepped cavity.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the topmost insulating layer 32, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 3:
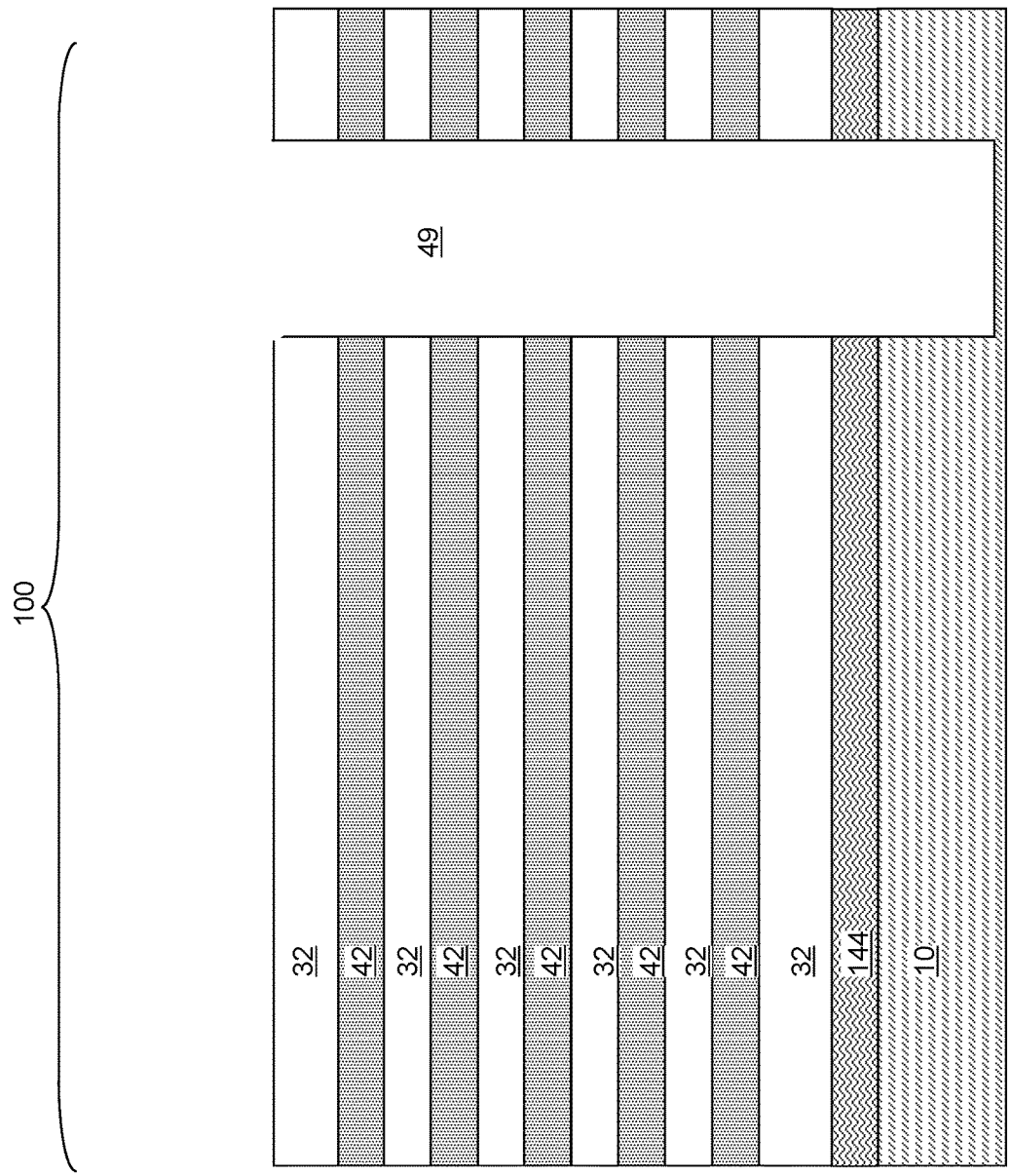
FIG. 3 is a vertical cross-sectional view of a region of the first exemplary structure after formation of a memory opening that vertically extends through the alternating stack according to the first embodiment of the present disclosure.

Referring to FIG. 3, a lithographic material stack (not shown) including at least a photoresist layer can be formed over the alternating stack (32, 42), and can be lithographically patterned to form openings within the memory array region 100. In one embodiment, the pattern of openings can be a periodic pattern that is repeated along at least one horizontal direction. In one embodiment, the pattern of the opening in the photoresist layer can include circular shapes, elliptical shapes, other polygonal shapes, and/or other closed shapes having a curvilinear periphery. In one embodiment, the pattern of the openings can be arranged as groups of two-dimensional periodic arrays within the memory array region 100.

The pattern in the lithographic material stack can be transferred through the entirety of the alternating stack (32, 42) and the sacrificial film 144 and optionally into an upper portion of the substrate 10 by at least one anisotropic etch that employs the patterned lithographic material stack as an etch mask. Portions of the alternating stack (32, 42) and the sacrificial film 144 that underlie openings in the patterned lithographic material stack are etched to form openings, which are herein referred to as memory openings 49. While only one memory opening 49 is illustrated in the drawings, it is understood that a plurality of memory openings 49 can be formed through the alternating stack (32, 42) and the sacrificial film 144. Any remaining portion of the lithographic material stack can be removed, for example, by ashing.

Figure 4:
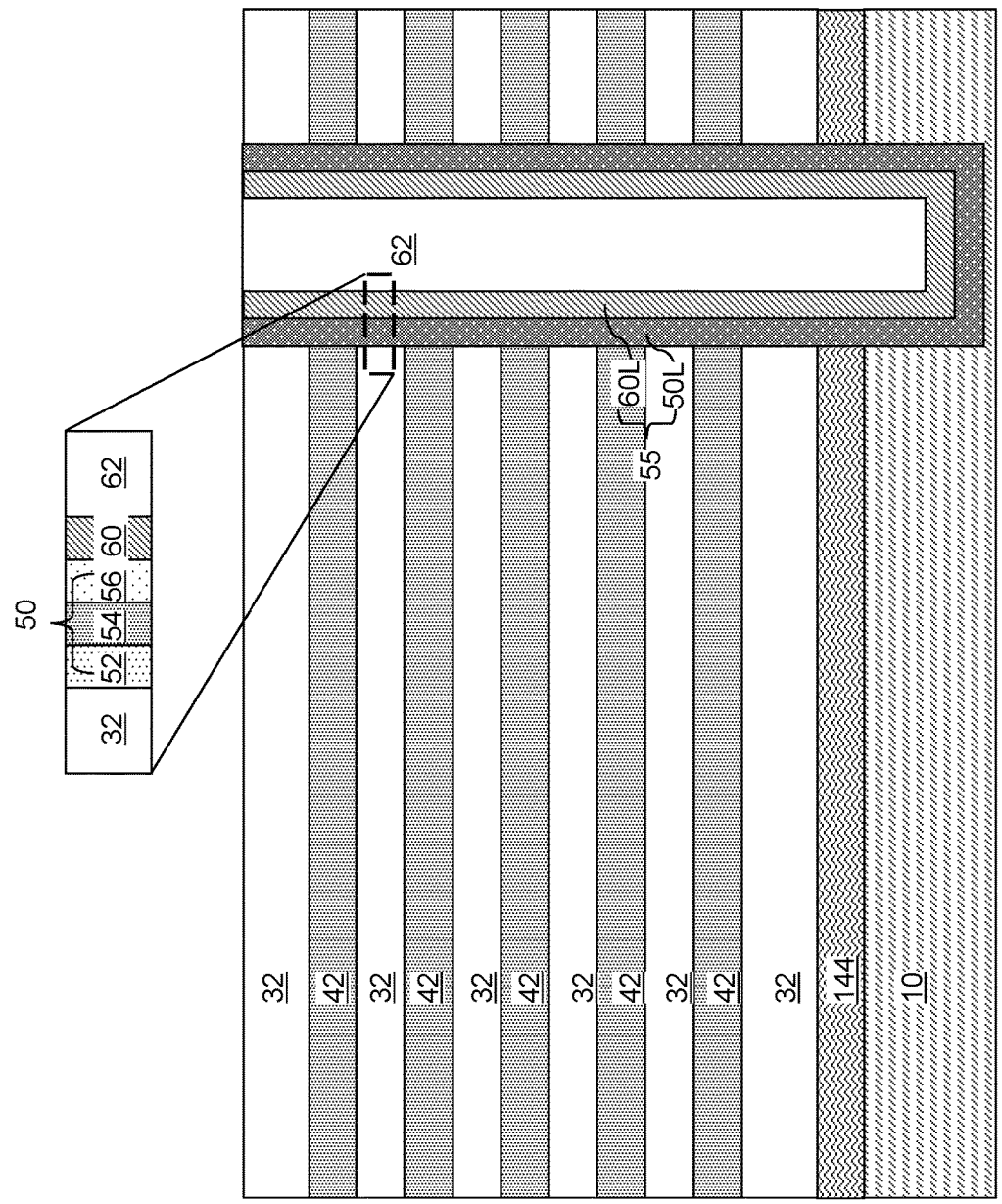
FIG. 4 is a vertical cross-sectional view of the region of the first exemplary structure after formation of a memory film, a vertical semiconductor channel, and a dielectric core according to the first embodiment of the present disclosure.

Referring to FIG. 4, a memory stack structure 55 is formed within each memory opening 49. Each memory stack structure 55 includes an in-process memory film SOL and a vertical in-process semiconductor channel 60L. As used herein, an "in-process" structure is a structure that is modified in a subsequent process, and thus, is present in the final structure in a modified form. The in-process memory film SOL can be formed, for example, by sequentially depositing at least one optional blocking dielectric layer 52, a memory material layer 54, and a tunneling dielectric layer 56.

The at least one blocking dielectric layer 52, if present, can be deposited on the sidewalls of each memory opening 49 by a conformal deposition method. Each of the at least one blocking dielectric layer 52 includes a dielectric material such as a dielectric metal oxide or a dielectric oxide containing at least one semiconductor element (such as silicon oxide). The thickness of the at least one blocking dielectric layer 52 can be in a range from 1 nm to 10 nm, although lesser and greater thicknesses can also be employed.

The memory material layer 54 can be a charge trapping material layer including a dielectric charge trapping material, which can be, for example, silicon nitride. Alternatively, the memory material layer 54 can include a conductive material such as doped polysilicon or a metallic material that is patterned into multiple electrically isolated portions. In this case, the second material layers 42 can be laterally recessed selective to the first material layers 32 prior to formation of the at least one blocking dielectric layer 52, and the memory material layer 54 can be formed as a plurality of disjoined vertically spaced conductive material portions within the lateral recesses into second material layers 42. In one embodiment, the memory material layer 54 includes a silicon nitride layer.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can be a stack including, from outside to inside, an outer silicon oxide layer, a silicon nitride layer, and an inner silicon oxide layer. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The in-process semiconductor channel 60L extends through the alternating stack (32, 42), and comprises an amorphous or polycrystalline semiconductor material deposited over the sidewall of each memory opening 49. The in-process semiconductor channel 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the in-process semiconductor channel 60L includes amorphous silicon or polysilicon. The in-process semiconductor channel 60L can be formed by a conformal deposition method such as low pressure chemical vapor deposition (LPCVD). The thickness of the in-process semiconductor channel 60L can be in a range from 2 nm to 20 nm, although lesser and greater thicknesses can also be employed.

In case a cavity is present within each memory opening after formation of the in-process semiconductor channel 60L, a dielectric core 62 may be formed within the cavity in each memory opening 49. The dielectric core 62, if present, comprises a dielectric material such as silicon oxide. The dielectric core 62 can be formed by deposition of the dielectric material into a remaining cavity within each memory opening, for example, by a conformal deposition method.

Excess portions of the in-process memory film 5OL, the in-process semiconductor channel 60L, and the dielectric material of the dielectric core 62 can be removed from above the top surface of the alternating stack (32, 42), for example, by chemical mechanical planarization (CMP). The in-process memory film 5OL, the in-process semiconductor channel 60L, and the dielectric core 62 within each memory opening collectively constitute a memory stack structure (50, 60, 62). Optionally, a drain region may be formed at the top end of the memory stack structure. Alternatively, the drain region may be formed at a later step in the process, such as at a step illustrated in FIG. 13, as will be described in more detail below.

Figure 5A:
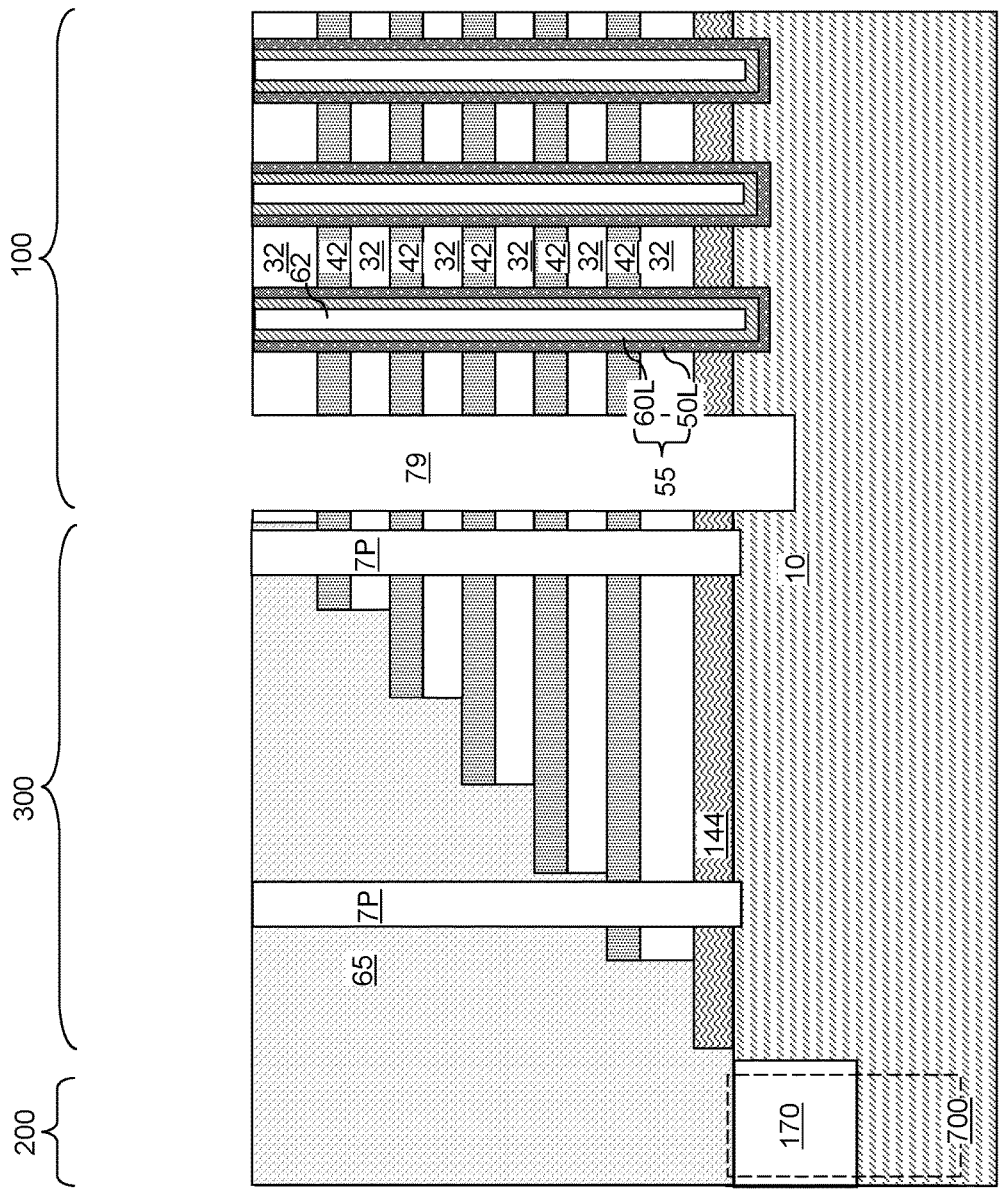
FIG. 5A is a vertical cross-sectional view of the region of the first exemplary structure after formation of a backside trench according to the first embodiment of the present disclosure.
Figure 5B:
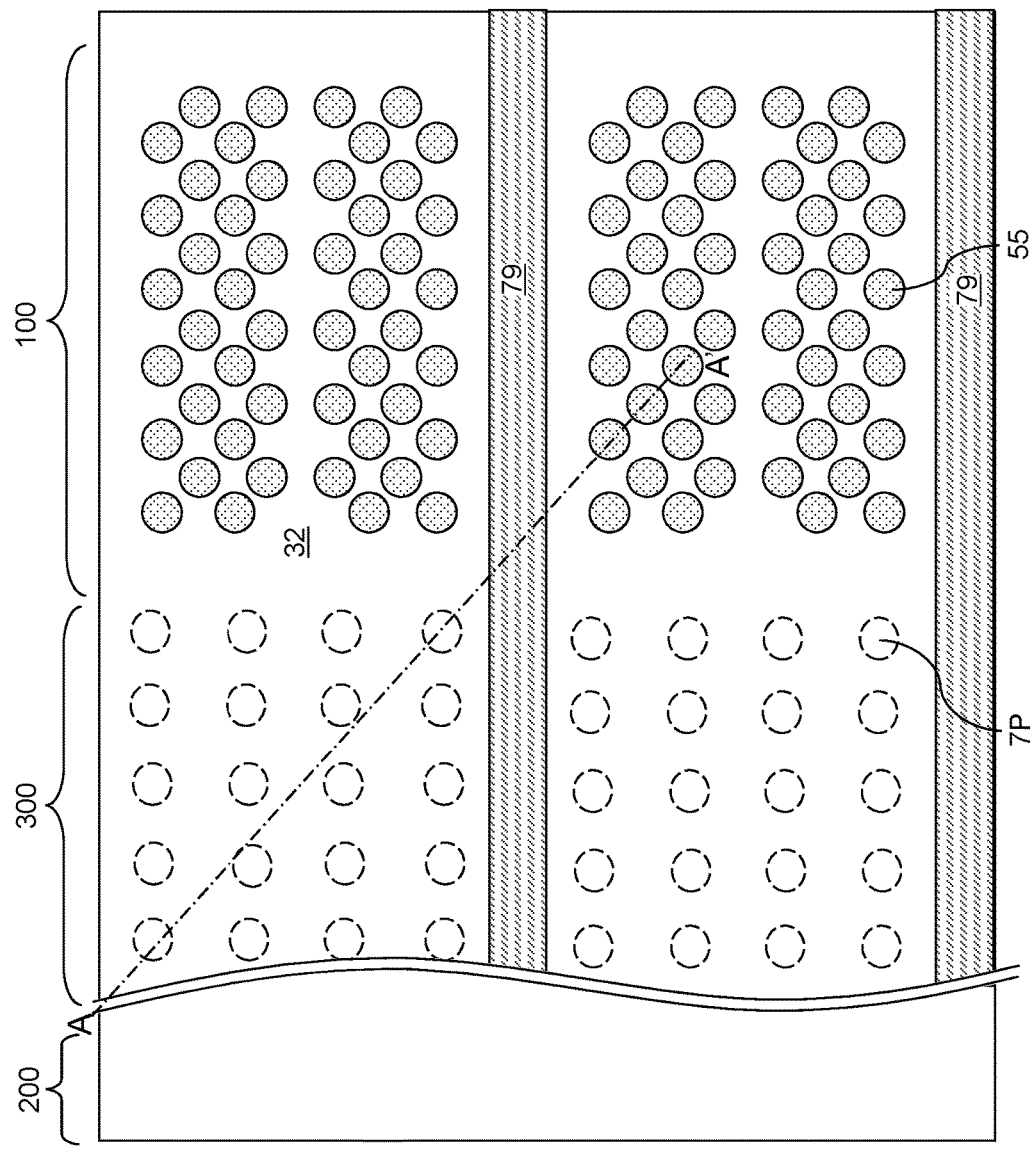
FIG. 5B is a top-down view of the first exemplary structure shown in FIG. 5A.

Referring to FIGS. 5A and 5B, support pillar structures 7P can be optionally formed in the contact region 300, for example, by forming support openings through the retro-stepped dielectric material portion 65, the alternating stack (32, 42), and the sacrificial film 144, and filling the support openings with a dielectric material such as silicon oxide. Excess portions of the dielectric material can be removed from above the horizontal plane including the topmost surface of the alternating stack (32, 42), for example, by a planarization process (such as a recess etch or chemical mechanical planarization (CMP)). Alternatively, the support pillar structures 7P can be formed concurrently with formation of the memory stack structures. In this case, the support openings can be formed concurrently with formation of the memory openings 49, and each support pillar structure 7P can include a same set of material portions as the memory stack structure 55. In this case, the support pillar structures 7P are not contacted by any contact via structures in subsequent processing steps to ensure that the support pillar structures 7P are electrically floating (i.e., the support pillar structures 7P comprise inactive or dummy memory stack structures).

Backside trenches 79 can be formed through the alternating stack (32, 42), for example, by application and patterning of a photoresist layer to form an opening, and by an anisotropic etch that transfers the pattern of the opening through the alternating stack (32, 42) and the sacrificial film 144 and into an upper portion of the substrate 10. The backside trenches 79 can generally extend along the word line horizontal direction that is perpendicular to the bit lines (i.e., perpendicular to the general direction of an interface between the memory array region 100 and the contact region 300, or perpendicular to the general direction of an interface between the contact region 300 and the peripheral device region 200). The backside trenches 79 can laterally isolate groups of memory openings 49. In one embodiment, each group of memory openings 49 located between a pair of backside trenches 79 can include an array of memory openings 49 that are arranged as a one-dimensional periodic array or as a two-dimensional periodic array. The photoresist layer can be subsequently removed, for example, by ashing.

Figure 6:
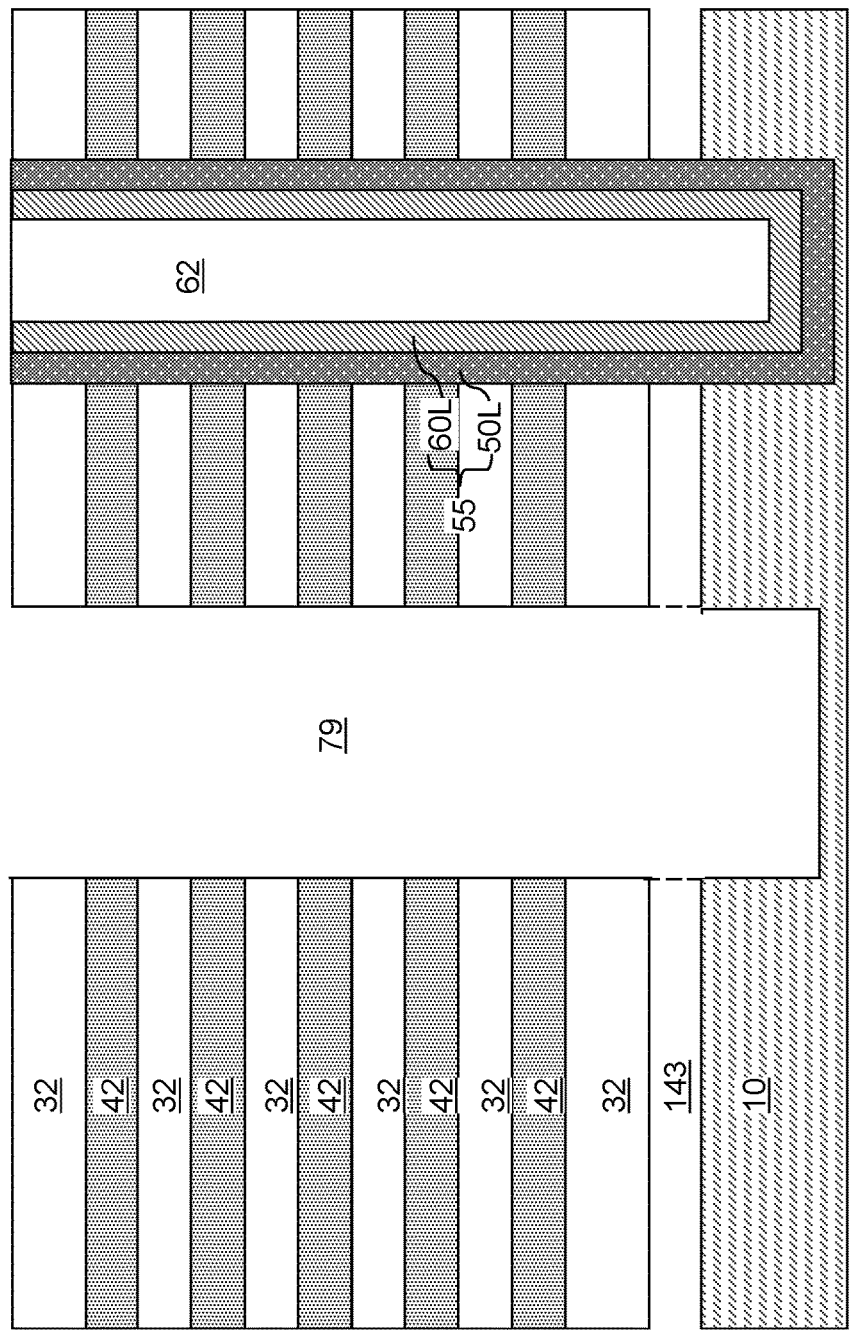
FIG. 6 is a vertical cross-sectional view of the region of the first exemplary structure after formation of a source level cavity by removal of the sacrificial film according to the first embodiment of the present disclosure.

Referring to FIG. 6, a source level cavity 143 can be formed by removing the sacrificial film 144 selective to the alternating stack (32, 42) and the substrate 10. In one embodiment, the source level cavity 143 can be formed by introducing an etchant or a reactant through the backside trench to remove the sacrificial film 144 selective to the alternating stack (32, 42) and to the substrate 10.

The etchant or reactant can be provided to the sacrificial film 144 through the backside trenches 79. The memory films 5OL can function as etch stop structures during removal of the sacrificial film 144. For example, if the sacrificial material of the sacrificial film 144 includes germanium or a silicon-germanium alloy, the insulating layers 32 include silicon oxide, and the sacrificial material layers 42 include silicon nitride, then a wet etch process employing ammonium hydroxide and hydrogen peroxide can be employed to remove the sacrificial film 144 selective to the substrate 10 and the alternating stack (32, 42). In another embodiment, if the sacrificial film 144 includes amorphous silicon, silicon carbide or silicon carbide phosphide, then a wet etch process employing HCl based chemistry in the presence of germane catalyst may be used to selectively remove the sacrificial film 144. In another embodiment, if the sacrificial material of the sacrificial film 144 includes amorphous carbon or diamond-like carbon, then an ashing process using a reactant (which can be an oxidant such as oxygen or ozone) can be employed to remove the sacrificial film 144, while not removing the substrate 10 or the alternating stack (32, 42). In another embodiment, the sacrificial film 144 and the insulating layers 32 may both comprise silicon oxide formed by different deposition methods, and the sacrificial film 144 is selectively etched due to the different etch rates of the silicon oxide materials of film 144 and layers 32, as shown in the table below:

|  | Etch Selectivity | Etching Method |
|---|---|---|
| DCS Oxide:DS Oxide | >3:1-28:1 (tunable) | CDE (Chemical Dry Etching) |
| HARP:HDP Oxide | >200:1 | CDE (Chemical Dry Etching) |

Figure 7:
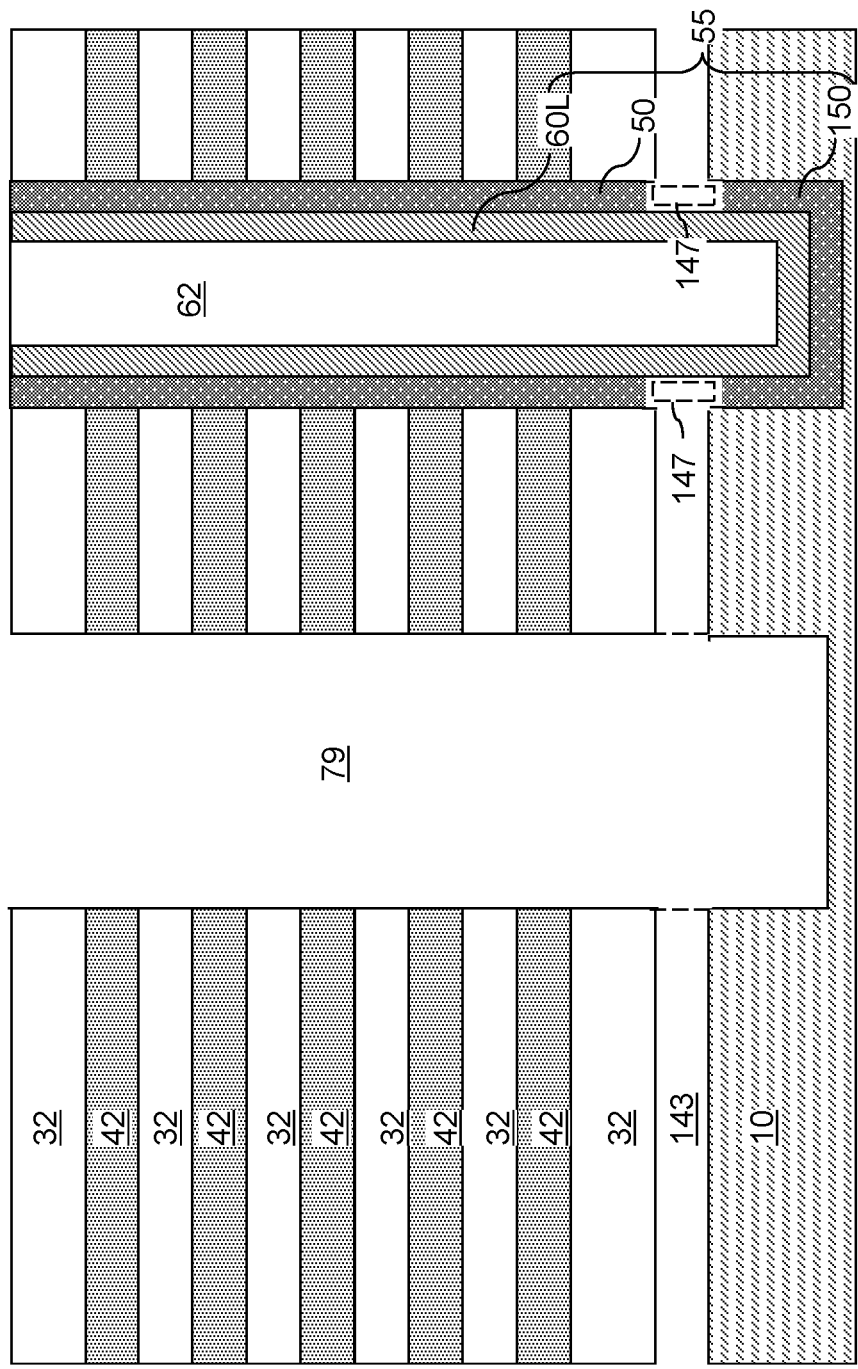
FIG. 7 is a vertical cross-sectional view of the region of the first exemplary structure after removal of an annular portion of the memory film around the source level cavity according to the first embodiment of the present disclosure.

Referring to FIG. 7, annular portion of each in-process memory film 50L can be removed around the source level cavity 143. An isotropic etch that removes the various layers of the in-process memory film SOL can be performed to physically expose a portion of each outer sidewall of the in-process semiconductor channel 60L. In some embodiments, the sacrificial material layers 42 may be collaterally recessed laterally by a distance that is on the order of the thickness of the in-process memory film SOL. An annular cavity 147 is formed around each in-process semiconductor channel 60L. The height of each annular cavity 147 can be greater than the height of the source level cavity 143 due to the isotropic nature of the etch process employed to remove the annular portions of the in-process memory films SOL.

A bottom portion of each in-process memory film SOL becomes separated from an upper portion of the in-process memory film SOL by a respective annular cavity 147. Each remaining upper portion of the in-process memory films SOL has a tubular shape and constitutes a memory film 50, and each remaining lower portion of the in-process memory films SOL has a cap shape, and is herein referred to as a dielectric cap portion 150. The dielectric cap portions 150 include an identical layer stack as the memory films 50. Each dielectric cap portion 150 has an outer sidewall that is vertically coincident with an outer sidewall of the overlying memory film 50. As used herein, a first vertical surface and a second vertical surface are "vertically coincident" if the first vertical surface and the second vertical surface overlap in a view along a vertical direction. Each memory stack structure 55, which is an in-process structure, includes an in-process semiconductor channel 60L, a memory film 50 contacting the in-process semiconductor channel 60L, and a dielectric cap portion 150 contacting the semiconductor channel 60L.

Figure 8:
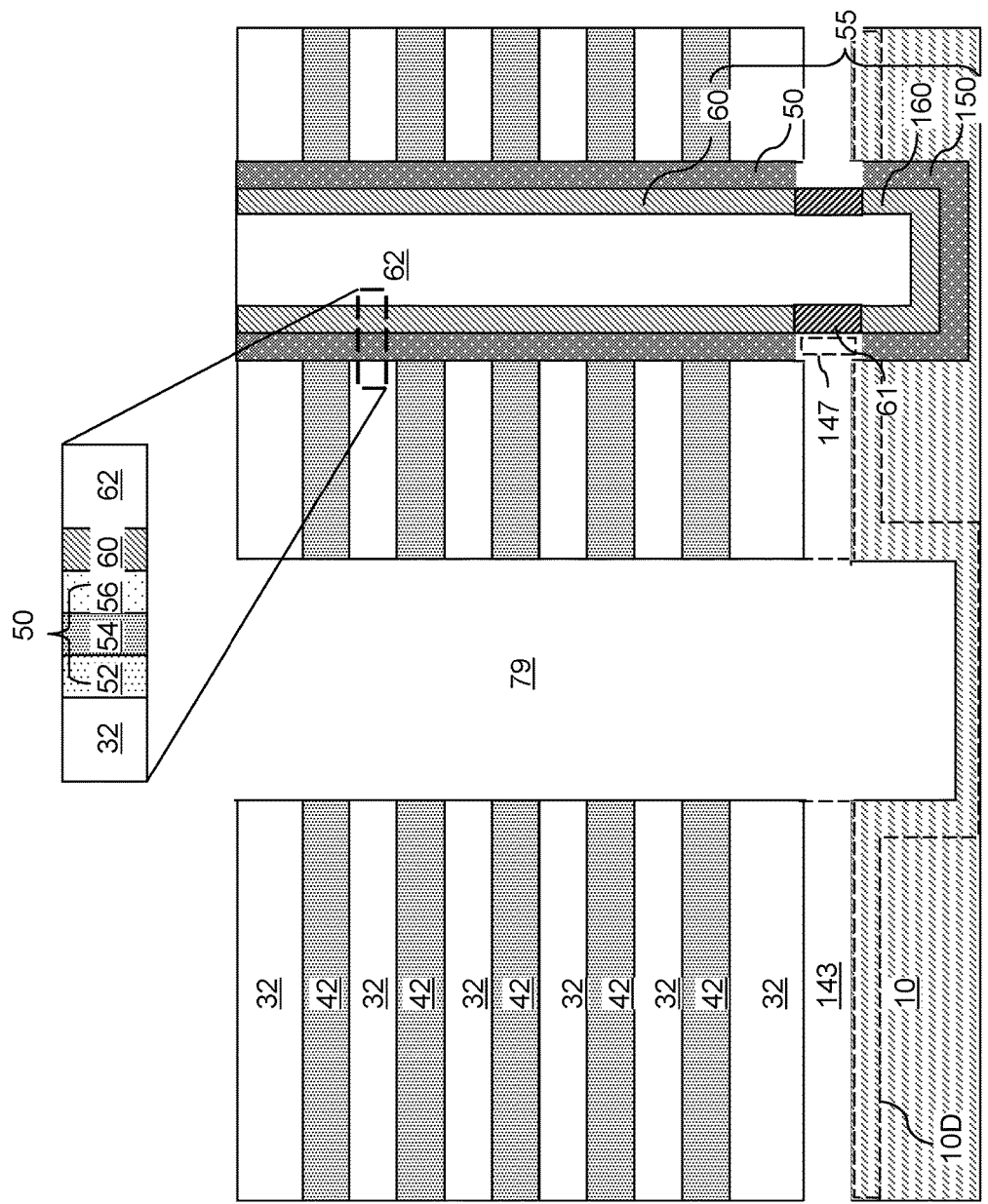
FIG. 8 is a vertical cross-sectional view of the region of the first exemplary structure after formation of an annular source region according to the first embodiment of the present disclosure.

Referring to FIG. 8, an annular portion of each in-process semiconductor channel 60L that is physically exposed to the annular cavities 147 is converted into a respective annular source region 61 by introduction of electrical dopants therein. For example, a plasma doping process or a gas phase doping process can be employed to dope the physically exposed annular portions of the in-process semiconductor channels 60L. If the in-process semiconductor channel 60L includes a doped semiconductor material of a first conductivity type (i.e., p-type or n-type), the annular source regions 61 can have a doping of a second conductivity type that is the opposite of the first conductivity type. If the in-process semiconductor channel 60L includes an intrinsic semiconductor material, the annular source regions 61 can have a p-type doping or an n-type doping. The dopant concentration in the annular source regions 61 can be in a range from $1.0 \times 10^{19}/cm^3$ to $1.0 \times 10^{21}/cm^3$ (such as from $5.0 \times 10^{19}/cm^3$ to $5.0 \times 10^{20}/cm^3$), although lesser and greater dopant concentrations can also be employed.

A doped semiconductor well 10D that continuously extends under the physically exposed surfaces of the substrate underneath the source level cavity 143 can be collaterally formed during formation of the source region 61 by doping of the surface portions of the substrate 10. The doped semiconductor well 10D can have a uniform thickness along the vertical direction and the lateral directions, and can have greater dopant concentration than the underlying portion of the substrate 10. In one embodiment, the substrate 10 as provided at the processing steps of FIG. 1 can have a doping of the first conductivity type, and the annular source regions 61 and the doped semiconductor well 10D can have a doping of the second conductivity type that is the opposite of the first conductivity type. In this case, a p-n junction can be formed between the doped semiconductor well 10D and an underlying portion of the substrate 10.

Remaining portions of each in-process semiconductor channel 60L include an upper tubular portion that contacts a respective memory film 50 and a lower cap portion that underlies a respective annular source region 61. The upper tubular portions of the in-process semiconductor channels 60L are vertical semiconductor channels 60 of vertical field effect transistors that extend through a respective memory opening. The remaining lower cap portions of the in-process semiconductor channel 60L are herein referred to as semiconductor cap portions 160. At this processing step, each memory stack structure 55, which is in a final form, includes the dielectric core, the vertical semiconductor channel 60, the memory film 50 (which includes an optional blocking dielectric layer 52, a memory material layer 54, and a tunneling dielectric layer 56), a semiconductor cap portion 160 (which contacts a bottom surface and a lower portion of the sidewall of a dielectric core 62), and a dielectric cap portion 150 that surrounds the semiconductor cap portion 160. Each semiconductor cap portion 160 contacts an annular bottom surface of a respective annular source region 61, is surrounded by a respective dielectric cap portion 150, and has the same composition as the vertical semiconductor channel 60.

Figure 9:
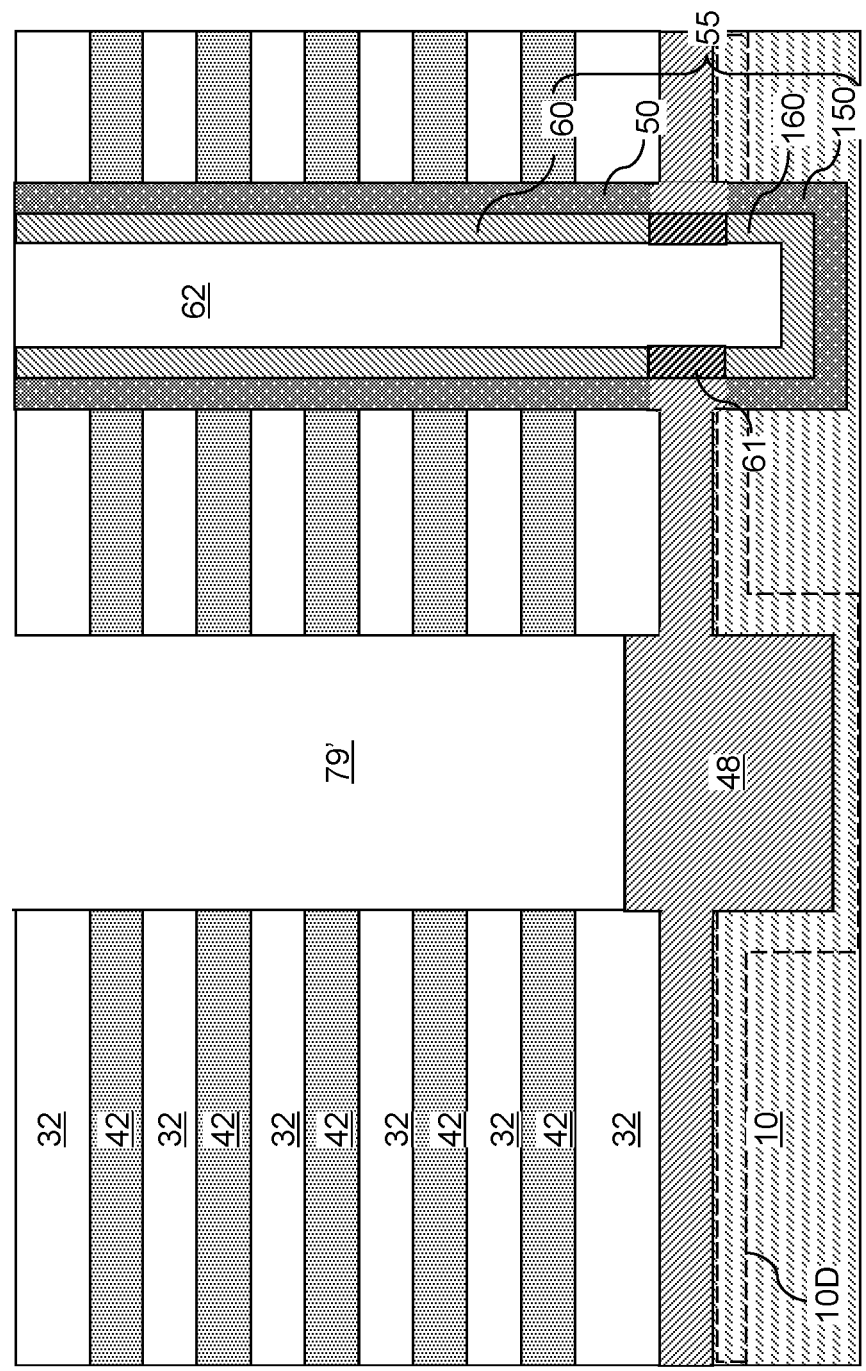
FIG. 9 is a vertical cross-sectional view of the region of the first exemplary structure after formation of a source contact layer by selective deposition of a doped semiconductor material according to the first embodiment of the present disclosure.

Referring to FIG. 9, a source contact layer 48 can be formed by selective deposition of a doped semiconductor material in the source level cavity 143 and lower portions of the backside trenches 79. The source contact layer 48 includes a doped semiconductor material having the same conductivity type (e.g., the second conductivity type) as the annular source regions 61. For example, the source contact layer 48 can include doped silicon, a doped silicon-germanium alloy, or a doped compound semiconductor material. In one embodiment, the source contact layer 48 is formed as a single continuous material layer extending underneath the entirety of the alternating stack (32 42) and among all backside trenches 79.

In one embodiment, the sacrificial material layers 42 can include a dielectric material (such as silicon nitride), and the source contact layer 48 can be formed by a selective semiconductor deposition process which grows a semiconductor material only from physically exposed semiconductor surfaces, and does not grow the semiconductor material from dielectric surfaces (such as the surfaces of the insulating layers 32 and the sacrificial material layers 42).

In a selective semiconductor deposition process (such as a selective epitaxy process), a reactant including a precursor for a semiconductor material and an etchant can be simultaneously or alternately flowed into a process chamber. Non-limiting examples of the precursor for the selective semiconductor deposition process include silane ($SiH_4$), dichlorosilane ($SiH_2Cl_2$), trichlorosilane ($SiHCl_3$), silicon tetrachloride ($SiCl_4$), disilane ($Si_2H_6$), germane ($GeH_4$), digermane ($Ge_2H_6$), and other organic or inorganic precursors including at least one semiconductor element. An exemplary etchant is hydrogen chloride (HCl) gas. Deposition and/or nucleation of a semiconductor material proceeds at a higher rate on semiconductor surfaces than on dielectric surfaces. The flow rate of the etchant can be controlled during the selective semiconductor deposition process such that the etch rate provided by the etchant can be between the deposition rates on the semiconductor surfaces and the deposition rate on the dielectric surfaces to enable the selective deposition of the doped semiconductor material.

The source contact layer 48 can include a doped epitaxial semiconductor material that is epitaxially aligned to the single crystalline material of the doped semiconductor well 10D, which is a portion of the substrate 10. In this case, the source contact layer 48 can be formed by a selective epitaxy process that deposits a doped single crystalline semiconductor material in the source level cavity 143 such that the deposited doped single crystalline semiconductor material is in epitaxial alignment with the single crystalline material in the substrate 10. Thus, if the substrate 10 comprises a single crystal silicon wafer or a single crystal silicon layer on a top surface of a wafer, then the source contact layer 48 comprises a single crystal silicon layer.

The entirety of the source level cavity 143 can be filled with the source contact layer 48. The duration of the selective semiconductor material deposition process can be selected such that the top surfaces of the source contact layer 48 include peripheries that are adjoined to sidewalls of the bottommost insulating layer 32. A backside cavity 79' is present within each backside trench 79.

Figure 10:
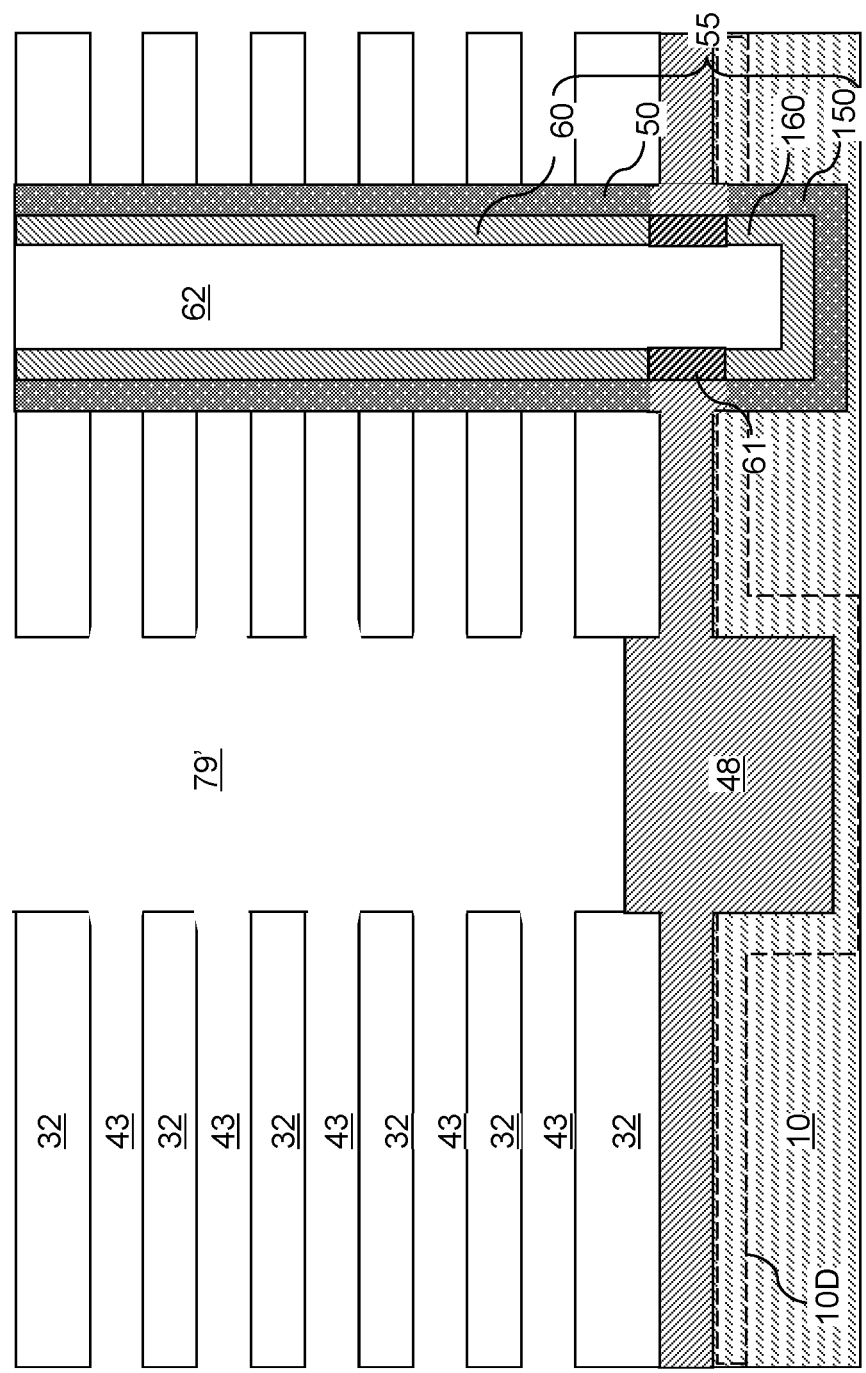
FIG. 10 is a vertical cross-sectional view of the region of the first exemplary structure after formation of backside recesses by removal of the sacrificial material layers according to the first embodiment of the present disclosure.

Referring to FIG. 10, an etchant that selectively etches the second material of the sacrificial material layers 42 with respect to the first material of the insulating layers 32 can be introduced into the backside trenches 79 in an etch process. Backside recesses 43 are formed in volumes from which the sacrificial material layers 42 are removed. The removal of the second material of the sacrificial material layers 42 can be selective to the first material of the insulating layers 32, the material of the at least one support pillar 7P, the material of the retro-stepped dielectric material portion 65, the doped semiconductor material of the source contact layer 48, and the material of the outermost layer of the memory films 50 (such as the material of the blocking dielectric layer 52). In one embodiment, the sacrificial material layers 42 can include silicon nitride, and the materials of the insulating layers 32, the at least one support pillar 7P, and the retro-stepped dielectric material portion 65 can be selected from silicon oxide and dielectric metal oxides.

The etch process that removes the second material of the sacrificial material layers 42 selective to the first material of the insulating layers 32 and the silicon oxide layers 52 of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one support pillar 7P, the retro-stepped dielectric material portion 65, and the memory stack structures 55 provide structural support while the backside recesses 43 are present within volumes previously occupied by the sacrificial material layers 42. The lateral etch is stopped on the etch stop layer 52.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the memory device region 100 comprises an array of monolithic three-dimensional NAND strings having a plurality memory stack structures 55 and a plurality of device levels disposed above the substrate 10. In this case, each backside recess 43 can define a space for receiving a respective word line of the array of monolithic three-dimensional NAND strings.

Each of the plurality of backside recesses 43 can extend substantially parallel to the top surface of the substrate 10. A backside recess 43 can be vertically bounded by a top surface of an underlying insulating layer 32 and a bottom surface of an overlying insulating layer 32. In one embodiment, each backside recess 43 can have a uniform height throughout.

Figure 11:
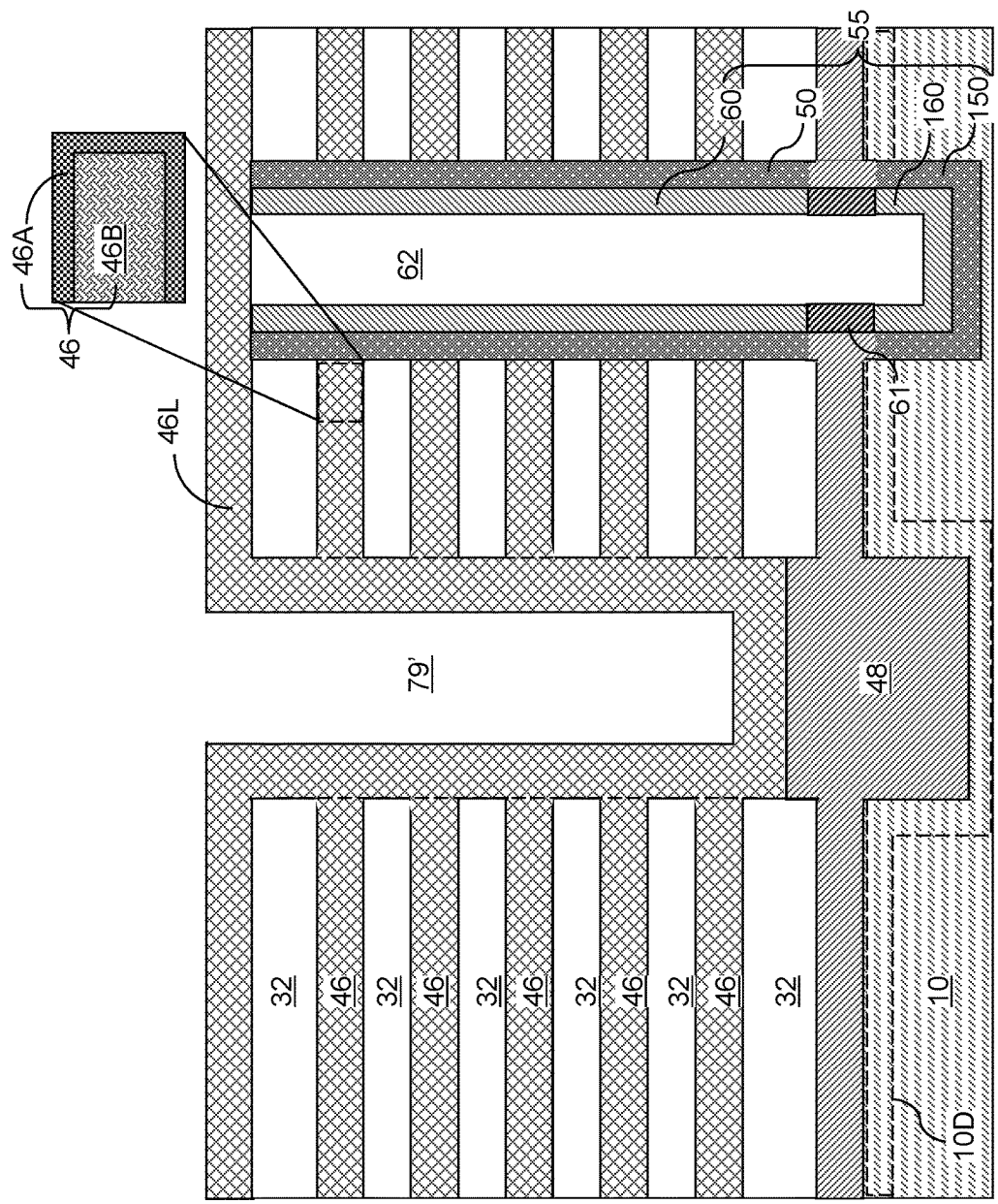
FIG. 11 is a vertical cross-sectional view of the region of the first exemplary structure after formation of electrically conductive layers according to the first embodiment of the present disclosure.

Referring to FIG. 11, a backside blocking dielectric layer (not shown) can be optionally formed in the backside recesses 43, for example, employing one or more conformal deposition methods. For example, a continuous silicon oxide layer and/or a continuous dielectric metal oxide layer can be sequentially formed in the backside recesses 43, over the sidewalls of the backside trench 79, and over the source contact layer 48.

At least one metallic material can be deposited in the unfilled volumes of the backside recesses 43, over the sidewalls of the at least one the backside trench 79, and over the top surface of upper insulating layer 32 in the stack. As used herein, a metallic material refers to an electrically conductive material that includes at least one metallic element. The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium.

In one embodiment, the at least one metallic material can include a metallic liner material including a conductive metal nitride (such as TiN, TaN, or WN) and a metallic fill material including an elemental metal (such as W, Co, Cu, or Al) or an intermetallic alloy of at least two elemental metals. In this case, a metallic liner 46A consisting essentially of the metallic liner material and a metal fill material layer 46B consisting essentially of at least one metal can be deposited in the backside recesses 43 and over the sidewalls of the backside trenches 79, the physically exposed top surface of the source contact layer 48, and the topmost insulating layer 32. In one embodiment, the metallic liner 46A can include titanium nitride, and the metal fill material layer 46B can include tungsten. In one embodiment, the metallic materials can be deposited by chemical vapor deposition or atomic layer deposition.

A plurality of electrically conductive layers 46 can be formed in the plurality of backside recesses 43, and a continuous metallic material layer 46L can be formed on the sidewalls of each backside trench 79 and over the contact level dielectric layer 73. Each of the electrically conductive layers 46 and the continuous metallic material layer 46L can include respective portions of the metallic liner 46A and the metallic fill material layer 46B. Thus, each sacrificial material layer 42 can be replaced with an electrically conductive layer 46. A backside cavity 79' is present in the portion of each backside trench 79 that is not filled with the optional backside blocking dielectric layer and the continuous metallic material layer 46L.

Figure 12:
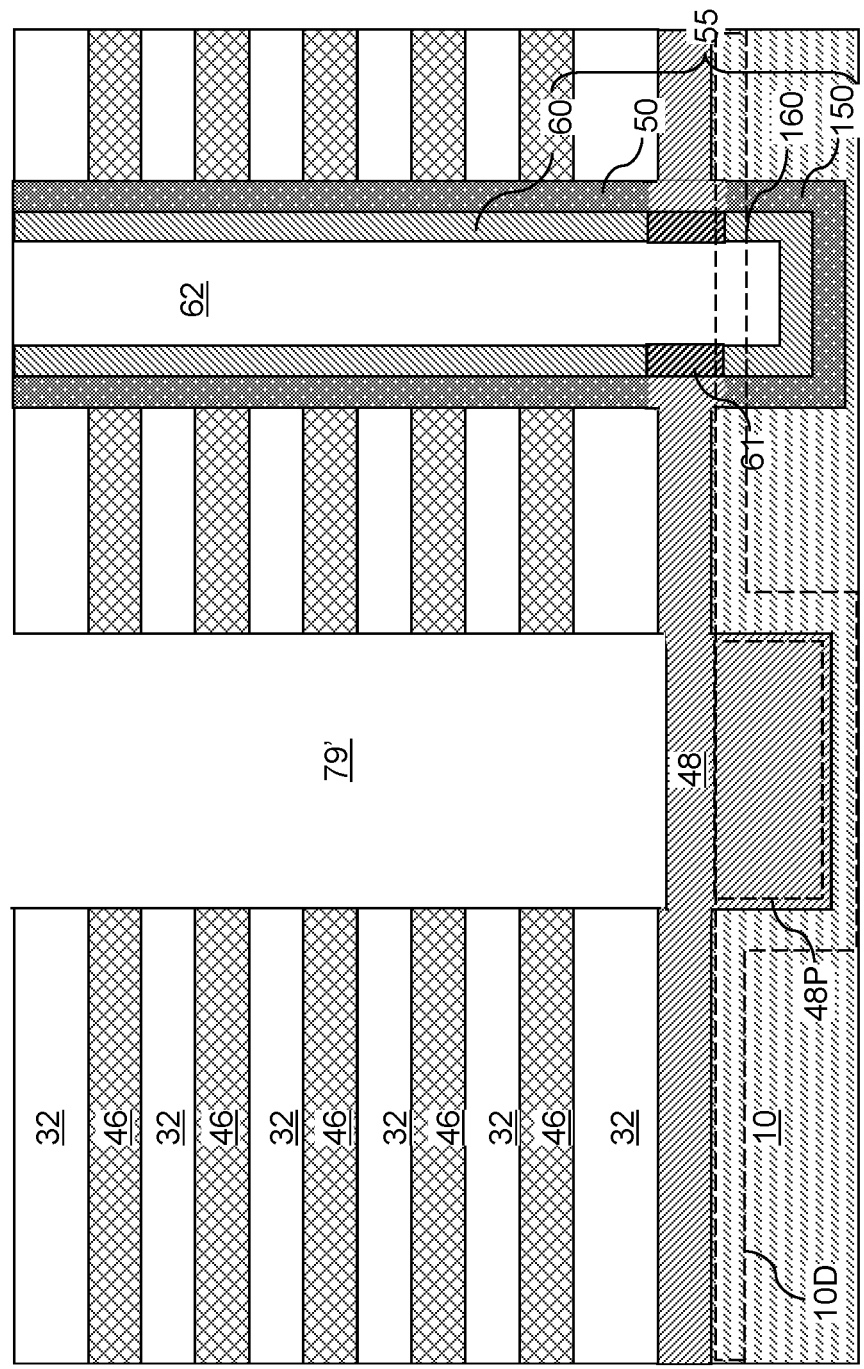
FIG. 12 is a vertical cross-sectional view of the region of the first exemplary structure after removal of a continuous conductive material layer according to the first embodiment of the present disclosure.

Referring to FIG. 12, the deposited metallic materials of the continuous electrically conductive material layer 46L is etched back from the sidewalls of each backside trench 79 and from above the uppermost insulating layer 32 in the stack (32, 46), for example, by an anisotropic or isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46. Optionally, top surfaces of the source contact layer 48 underlying the backside cavities 79' may be vertically recessed collaterally during the etch process that removes the continuous electrically conductive material layer 46L.

After removal of the continuous electrically conductive material layer 46L, the top surfaces of the source contact layer 48 underlying the backside cavities 79' can be located at, below, or on, the sidewalls of the bottommost insulating layer 32. The source contact layer 48 can include multiple pillar portions 48P, which can be located underneath each backside cavity 79' and protrude downward from a horizontal portion of the source contact layer 48.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 13:
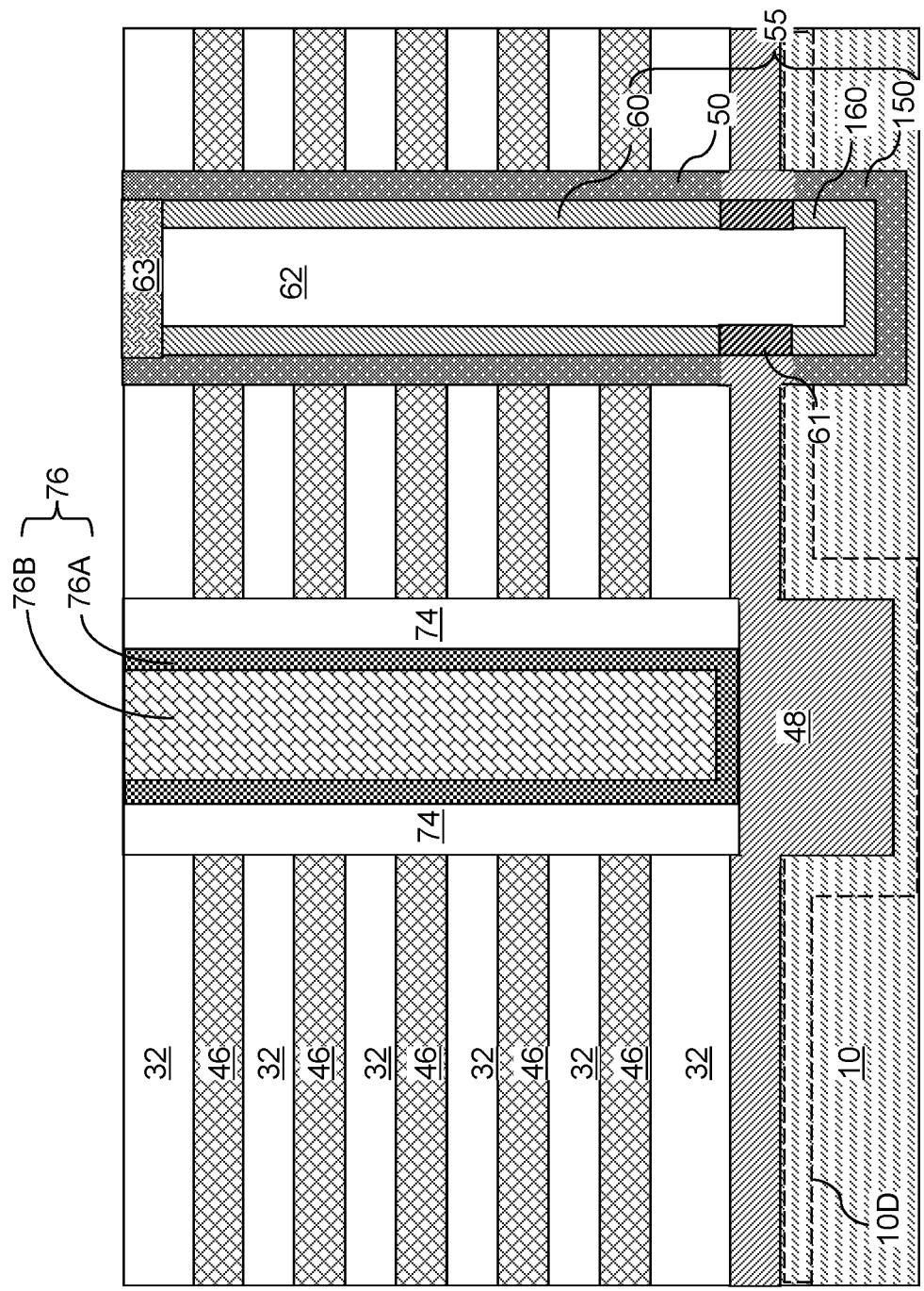
FIG. 13 is a vertical cross-sectional view of the region of the first exemplary structure after formation of an insulating spacer and a backside contact via structure according to the first embodiment of the present disclosure.

Referring to FIG. 13, an insulating spacer 74 can be formed by deposition of a conformal insulating material layer and an anisotropic etch that removes horizontal portions of the conformal insulating material layer. The insulating spacer 74 includes a dielectric material such as silicon oxide, silicon nitride, and/or a dielectric metal oxide.

A backside contact via structure 76 can be formed within each cavity 79'. Each backside contact via structure 76 can fill a respective cavity 79'. Each backside contact via structure 76 can be formed inside an insulating spacer 74 located within a respective backside trench 79. The backside contact via structures 76 can be formed by depositing at least one conductive material in each remaining unfilled volume (i.e., the cavities 79') of the backside trenches 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof. Alternatively, the backside contact via structures 76 may comprise a doped semiconductor material (such as doped polysilicon) and a metal, such as tungsten.

The at least one conductive material can be planarized, for example, by chemical mechanical planarization (CMP). Each remaining continuous portion of the at least one conductive material in the backside trenches 79 constitutes a backside contact via structure 76. Each backside contact via structure 76 can be formed directly on a top surface of the source contact layer 48 and a sidewall of a respective insulating spacer 74.

A drain region 63 can be formed on a top portion of each memory stack structure 55. Specifically, the dielectric cores 62 can be vertically recessed with respect to the topmost insulating layers 32 to form recess regions. The recess regions can be formed, for example, by applying and patterning a photoresist layer over the alternating stack (32, 46) of the insulating layers 32 and the electrically conductive layers 46 to form openings overlying the memory stack structures 55, and etching the top portions of the dielectric cores 62 by an isotropic etch or an anisotropic etch. The photoresist layer can be subsequently removed, for example, by ashing. A doped semiconductor material having a doping of the second conductivity type can be deposited in the recess regions. Excess portions of the deposited doped semiconductor material can be removed from above the horizontal plane including the top surface of the topmost layer of the alternating stack (32, 46) by a planarization process such as chemical mechanical planarization and/or a recess etch. Each remaining portion of the doped semiconductor material constitutes the drain regions 63.

Figure 14A:
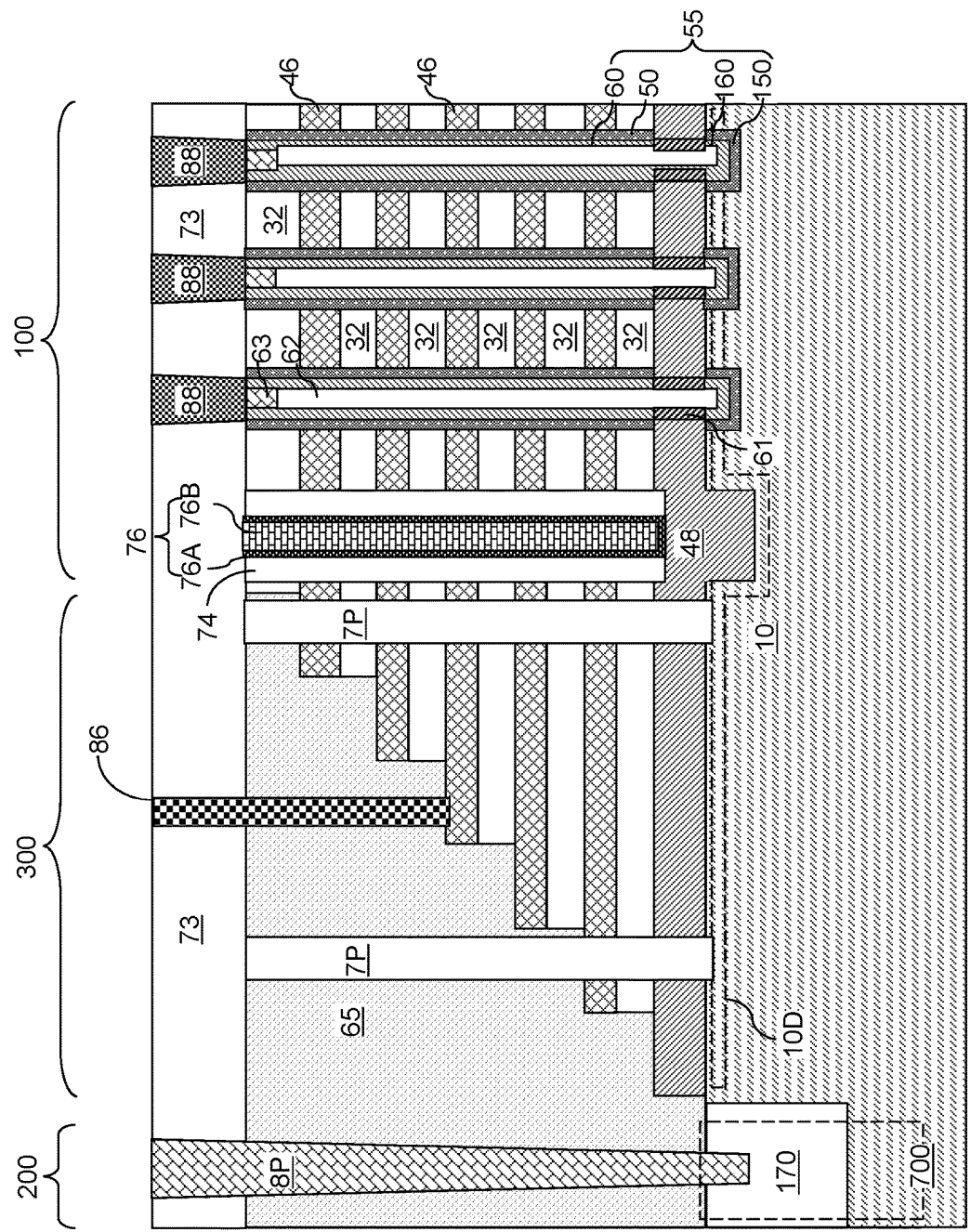
FIG. 14A is a vertical cross-sectional view of the first exemplary structure after formation of various additional contact via structures according to the first embodiment of the present disclosure.
Figure 14B:
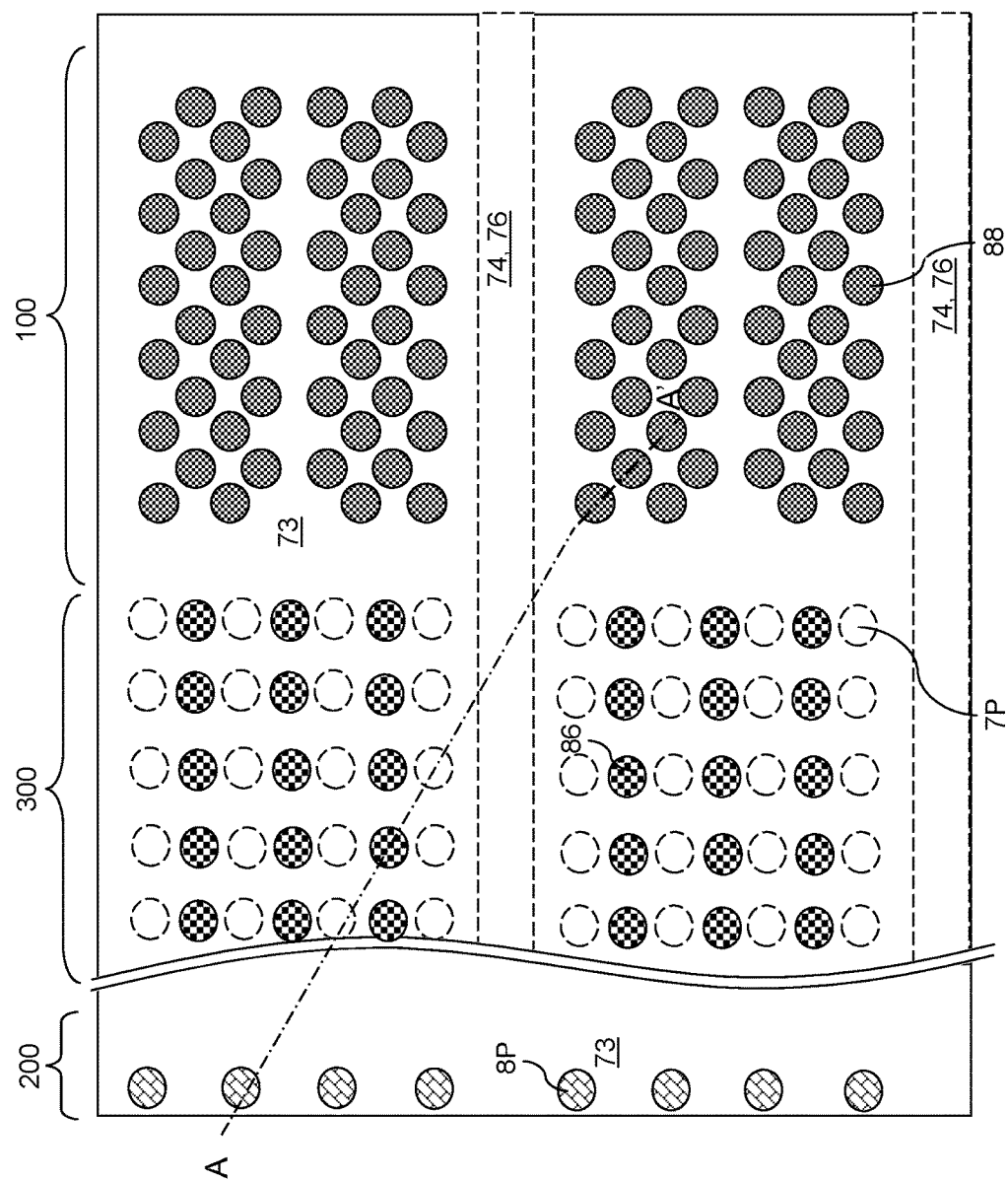
FIG. 14B is a top-down view of the first exemplary structure of FIG. 14A.

Referring to FIGS. 14A and 14B, a contact level dielectric layer 73 can be formed over the alternating stack (32, 46). The contact level dielectric layer 73 includes a dielectric material such as silicon oxide, organosilicate glass (OSG), silicon nitride, and/or a dielectric metal oxide. Additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73 and through the retro-stepped dielectric material portion 65. Device contact via structures 8P can be formed through the retro-stepped dielectric material portion 65 directly on respective nodes of the semiconductor devices 700, which can be peripheral devices for the memory array within the memory array region 100. A line level dielectric layer (not shown) can be formed over the contact level dielectric layer 73. Bit lines (not shown) in electrical contact with the drain contact via structures 88 can be formed in the line level dielectric layer. Additional line level interconnect structures can be formed in the line level dielectric layer to electrically connect the word line contact via structures 86 with the device contact via structures 8P. As used herein, two elements are electrically connected to each other if there exists an electrically conductive path between the two elements.

Figure 15:
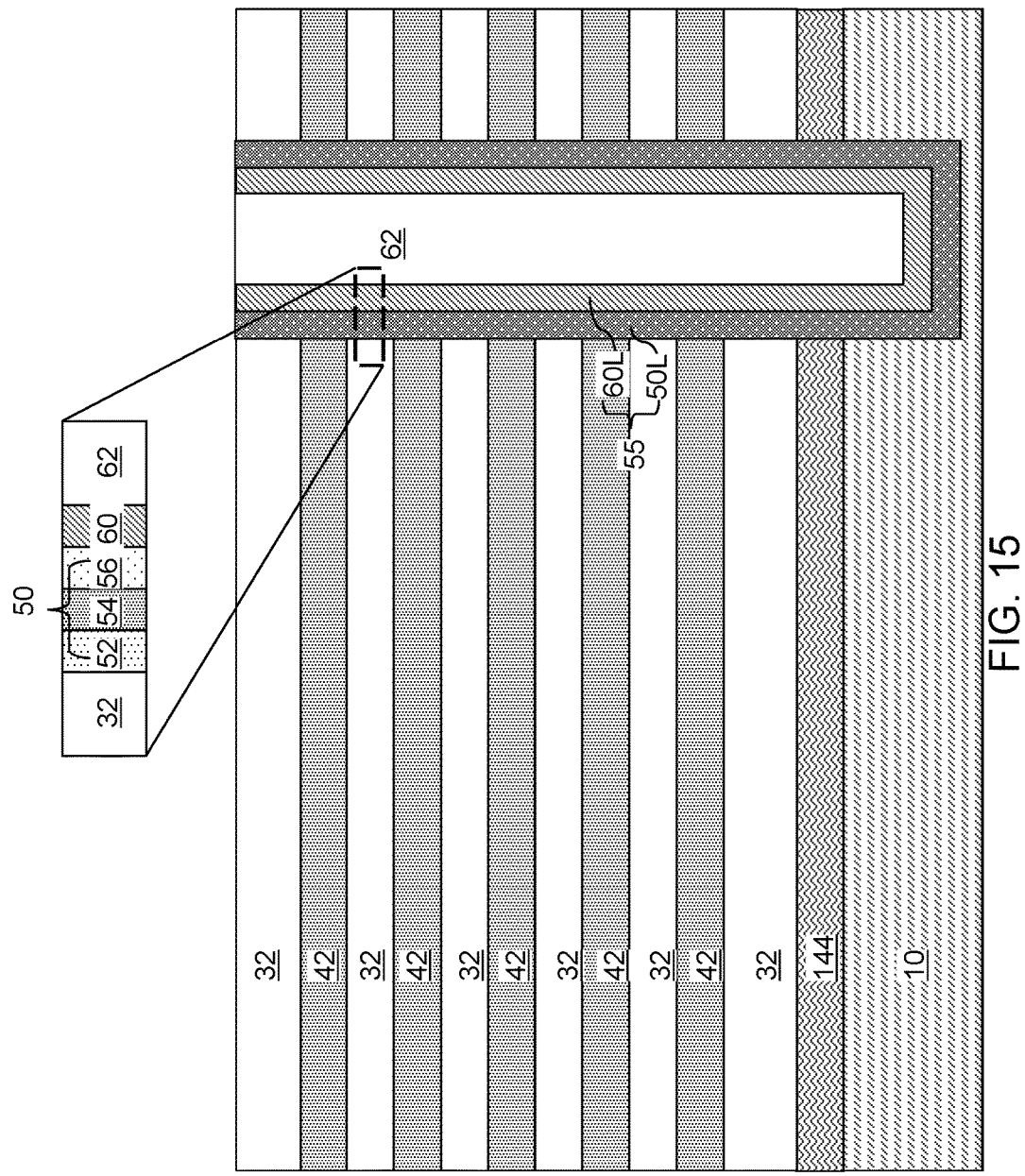
FIG. 15 is a region of a second exemplary structure after formation of a memory film, a vertical semiconductor channel, and a dielectric core according to a second embodiment of the present disclosure.

Referring to FIG. 15, an in-process second exemplary structure according to a second embodiment of the present disclosure is illustrated, which can be the same as the in-process first exemplary structure of FIG. 4.

Figure 16:
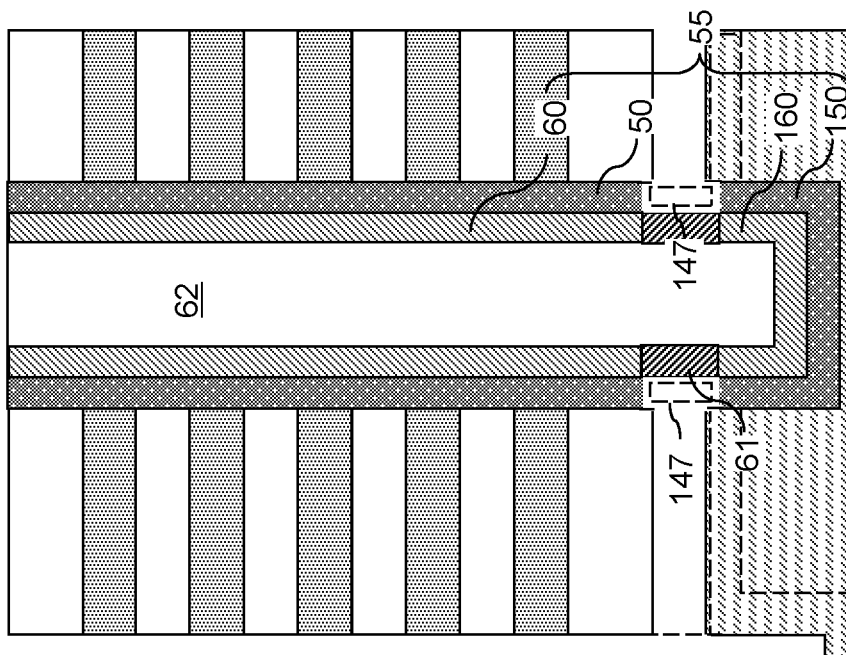
FIG. 16 is a vertical cross-sectional view of the region of the second exemplary structure after formation of a source level cavity and removal of an annular portion of the memory film around the source level cavity according to the second embodiment of the present disclosure.

Referring to FIG. 16, the processing steps of FIGS. 5A, 5B, 6 and 7 can be performed to form a source level cavity 143 and annular cavities 147. The annular cavities 147 are formed around the in-process semiconductor channels 60L. After formation of the annular cavities 147, surfaces of the in-process semiconductor channel 60 are physically exposed. The processing steps of FIG. 8 can be performed to form annular source regions 61 and a doped semiconductor well 10D.

Figure 17:
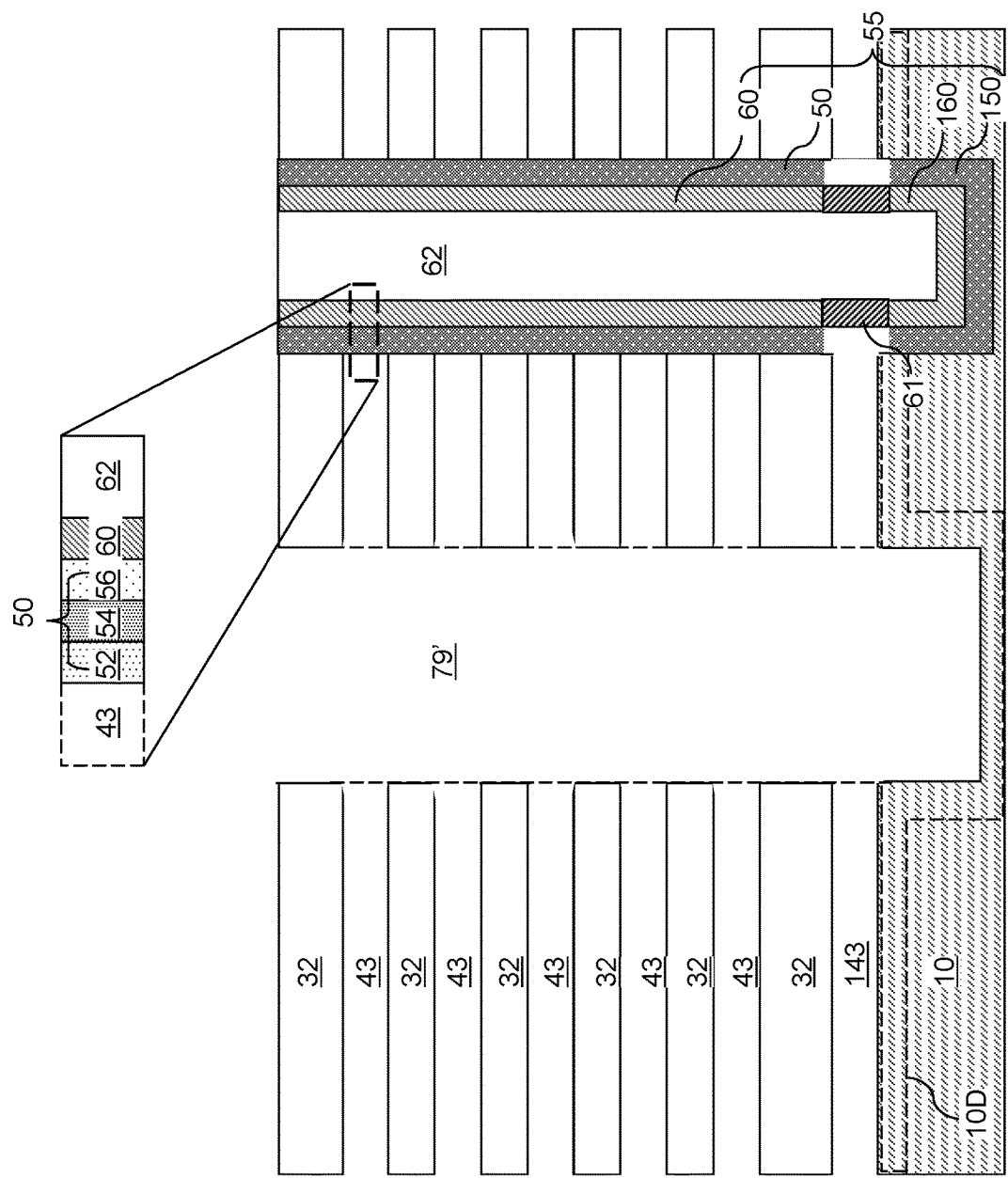
FIG. 17 is a vertical cross-sectional view of the region of the second exemplary structure after formation of backside recesses by removal of the sacrificial material layers according to the second embodiment of the present disclosure.

Referring to FIG. 17, the processing steps of FIG. 10 can be performed to form backside recesses 43 while the source level cavity 143 is present and after the annular cavities 147 are at least partially formed. The selective etch process that removes the material of the sacrificial material layers 42 can be selective to the materials of the insulating layers 32, the doped semiconductor well 10D, and the annular source regions 61. The outermost layer of the memory film 50, such as the blocking dielectric layer 52, can be employed as an etch stop layer for the etch process that removes the sacrificial material layers 42.

Figure 18:
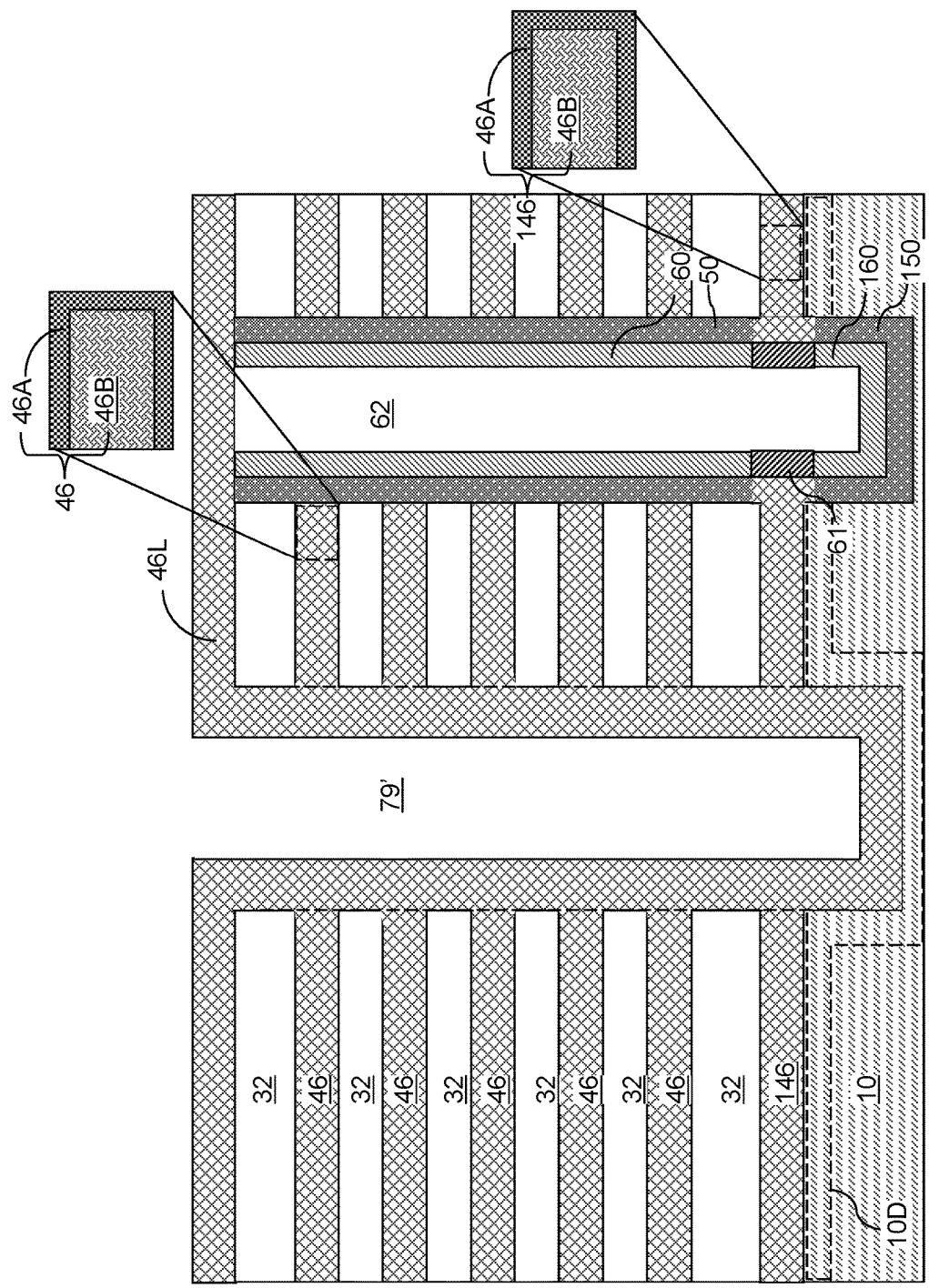
FIG. 18 is a vertical cross-sectional view of the region of the second exemplary structure after concurrently formation of a source contact layer and electrically conductive layers according to the second embodiment of the present disclosure.

Referring to FIG. 18, the processing steps of FIG. 11 can be performed. Specifically, a backside blocking dielectric layer (not shown) can be optionally formed in the backside recesses 43, for example, employing one or more conformal deposition methods. Subsequently, at least one conductive material can be deposited in the source level cavity 143 and the backside recesses 43, and over the sidewalls of the backside trenched 79, the bottom surfaces of the backside trenches 79, and the topmost insulating layer 32. A source contact layer 146, electrically conductive layers 46 and a continuous metallic material layer 46L can be simultaneously formed in the source level cavity 143, in the backside recesses 43, and in the backside trenches 79 and over the topmost insulating layer 32, respectively.

In one embodiment, the at least one metallic material can include a metallic liner material including a conductive metal nitride (such as TiN, TaN, or WN) and a metallic fill material including an elemental metal (such as W, Co, Cu, or Al) or an intermetallic alloy of at least two elemental metals. In this case, a stack of a metallic liner 46A consisting essentially of the metallic liner material and a metal fill material layer 46B consisting essentially of at least one metal can be deposited in the source level cavity 143 and the backside recesses 43, and over the sidewalls of the backside trenches 79, and the topmost insulating layer 32. In one embodiment, the metallic liner 46A can include titanium nitride, and the metal fill material layer 46B can consist essentially of at least one metal such as tungsten. In one embodiment, the metallic materials can be deposited by chemical vapor deposition or atomic layer deposition.

The source contact layer 146 can fill the entire volume of the source level cavity 143. A plurality of electrically conductive layers 46 can be formed in the plurality of backside recesses 43. A continuous metallic material layer 46L can be formed on the sidewalls of each backside trench 79 and over the topmost insulating layer 32. Each of the source contact layer 146, the electrically conductive layers 46, and the continuous metallic material layer 46L can include respective portions of the metallic liner 46A and the metallic fill material layer 46B. Thus, the sacrificial film 144 is replaced with the source contact layer 146, and each sacrificial material layer 42 can be replaced with an electrically conductive layer 46. A backside cavity 79' is present in the portion of each backside trench 79 that is not filled with the continuous metallic material layer 46L. The source contact layer 146 can be formed directly on each annular source region 61.

Figure 19:
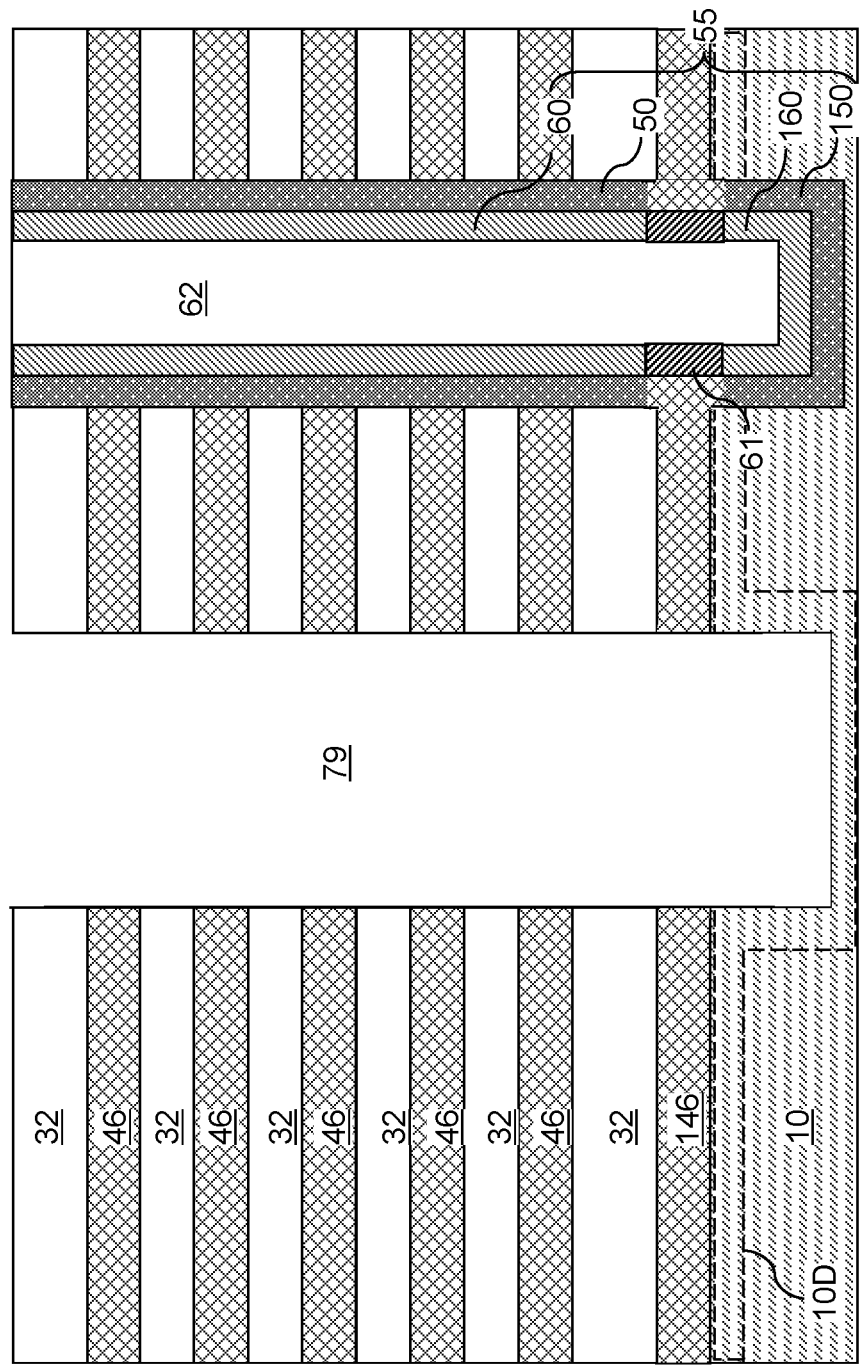
FIG. 19 is a vertical cross-sectional view of the region of the second exemplary structure after removal of a continuous conductive material layer according to the second embodiment of the present disclosure.

Referring to FIG. 19, the processing steps of FIG. 12 can be performed to remove the continuous metallic material layer 46L. The electrically conductive layers 46 and the source contact layer 146 are separated from one another after removal of the continuous metallic material layer 46L.

Figure 20:
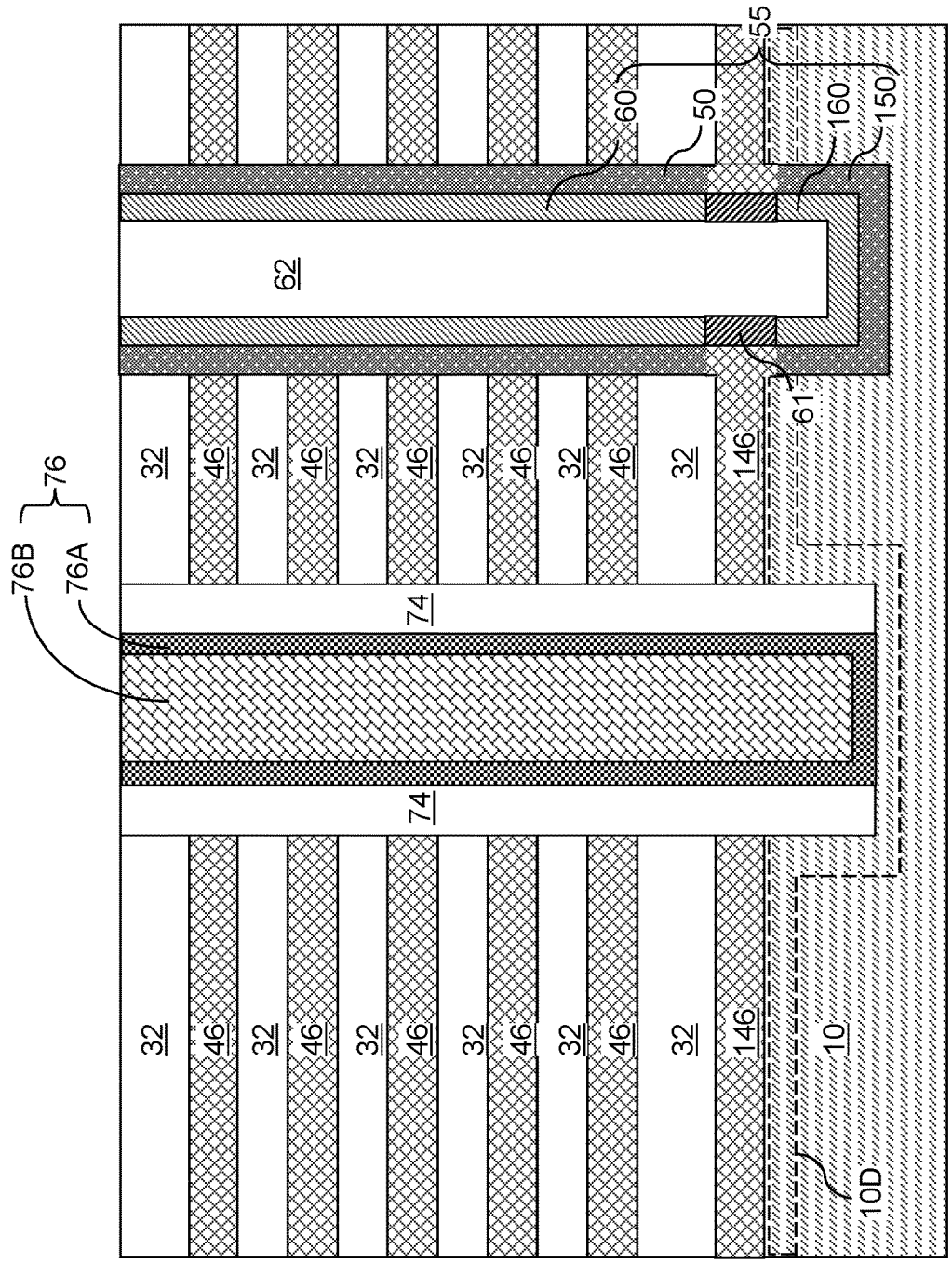
FIG. 20 is a vertical cross-sectional view of the region of the second exemplary structure after formation of an insulating spacer and a backside contact via structure according to the second embodiment of the present disclosure.

Referring to FIG. 20, the processing steps of FIG. 13 can be performed to form insulating spacers 74 and backside contact via structures 76. Each insulating spacer 74 can be formed directly on a sidewall of the source contact layer 146, sidewalls of the electrically conductive layers 46, a sidewall of the doped semiconductor well 10D, and a peripheral portion of a recessed top surface of the doped semiconductor well 10D. Each backside contact via structure 76 can be formed directly on a sidewall of a respective insulating spacer 74 and a center portion of a recessed top surface of the doped semiconductor well 10D.

In the second embodiment, the backside contact via structure 76 is physically separated from the source contact layer 146 by the insulating spacer 74. Thus, the backside contact via structure 76 does not directly physically contact the source contact layer 146. However, the backside contact via structure 76 is electrically connected to the source contact layer 146 through the doped semiconductor well 10D located in the semiconductor substrate 10. Therefore, the electric charge carriers, such as electrons, travel indirectly from the backside contact via structure 76 to the source contact layer 146 through the doped semiconductor well 10D.

Figure 21:
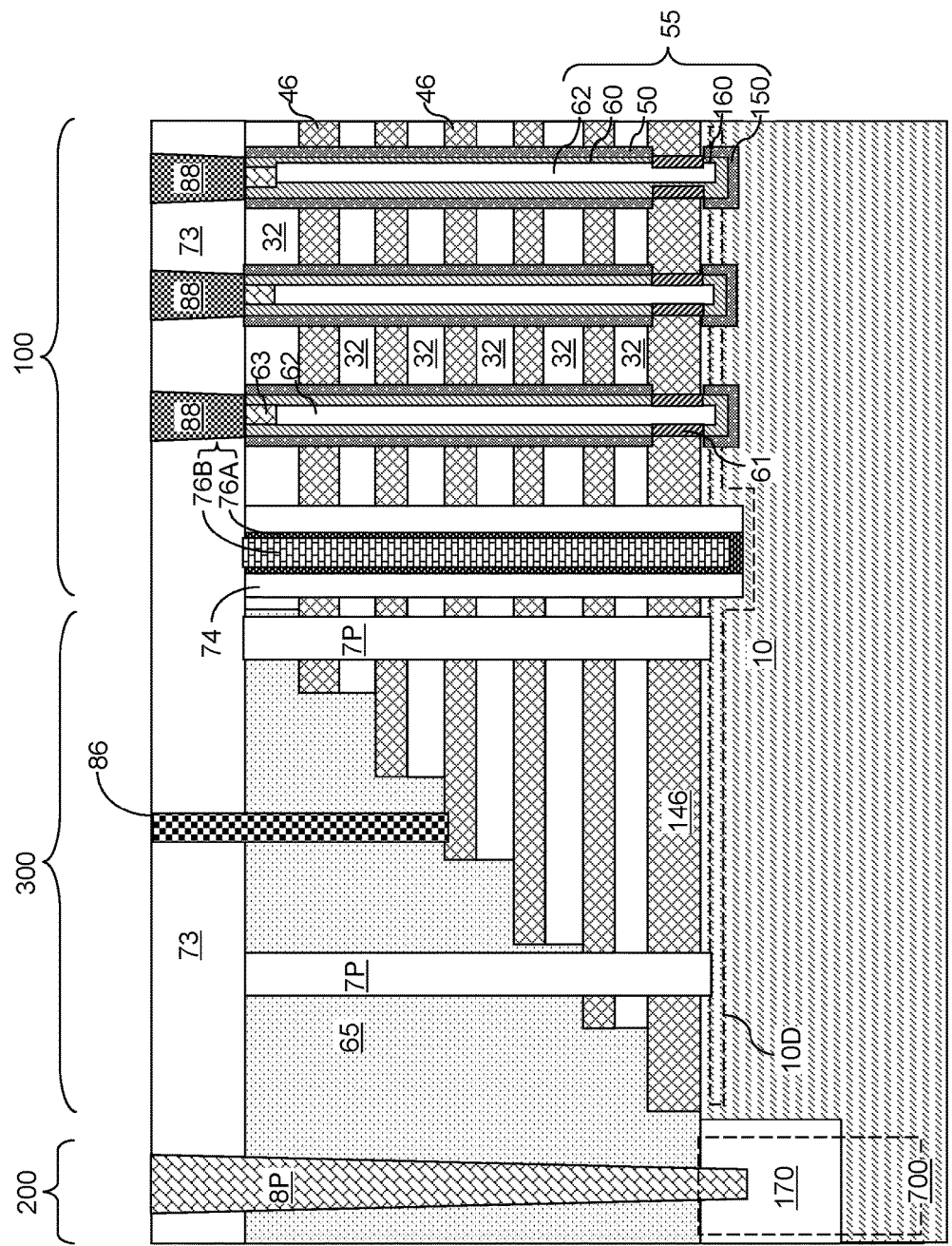
FIG. 21 is a vertical cross-sectional view of the second exemplary structure after formation of various additional contact via structures according to the second embodiment of the present disclosure.

Referring to FIG. 21, a contact level dielectric layer 73 and various additional contact via structures (88, 86, 8P) can be formed in the same manner as in the first embodiment.

Each of the first and second exemplary structures can include a three-dimensional memory device. The three-dimensional memory device includes a substrate including a substrate 10 (which includes the doped semiconductor well 10D and an underlying semiconductor material portion), an alternating stack (32, 46) of insulating layers 32 and electrically conductive layers 46 located over the substrate 10; a memory stack structure 55 extending through the alternating stack (32, 46) and comprising a memory film 50 and a vertical semiconductor channel 60; an annular source region 61 contacting a bottom end of the vertical semiconductor channel 60, having a same thickness as the vertical semiconductor channel 60, and having an inner sidewall that is vertically coincident with an inner sidewall of the vertical semiconductor channel 60; and a source contact layer (48 or 146) located between the alternating stack (32, 46) and the substrate 10, and contacting an outer sidewall of the annular source region 61, an annular bottom surface of the memory film 50, and a top surface of the substrate 10.

In one embodiment, the three-dimensional memory device can further include a backside contact trench 79 extending through the alternating stack (32, 46), an insulating spacer 74 located at a periphery of the backside trench 79, and a backside contact via structure 76 located within the insulating spacer 74 and electrically shorted to the source contact layer (48 or 146).\

In one embodiment, the source contact layer 48 can contact a bottom surface of the backside contact via structure 76 as illustrated in FIG. 14A. In one embodiment, the substrate 10 can include a portion having a doping of a first conductivity type, and the source contact layer 48 comprises a doped semiconductor material having a doping of a second conductivity type that is an opposite of the first conductivity type. In one embodiment, the source contact layer 48 comprises a doped single crystalline semiconductor material in epitaxial alignment with a single crystalline material within the substrate 10.

In one embodiment, the annular source region 61 comprises a polycrystalline doped semiconductor material having a doping of the second conductivity type. In one embodiment, the source contact layer 48 comprises a pillar portion 48P that extends below a topmost surface of the substrate 10 underneath the insulating spacer 74 and the backside contact via structure 76. In one embodiment, the source contact layer 48 contacts an annular bottom surface of the insulating spacer 74.

In the second embodiment, the source contact layer 146 contacts an outer sidewall of the insulating spacer 74 as illustrated in FIG. 21. In this embodiment, the source contact layer 146 comprises a same set of metallic materials as the electrically conductive layers 46.

In one embodiment, the three-dimensional memory device can include a doped semiconductor well 10D located within the substrate 10. The substrate 10 can include a portion having a doping of a first conductivity type. The doped semiconductor well 10D can comprise a doped semiconductor material having a doping of a second conductivity type that is an opposite of the first conductivity type. The doped semiconductor well 10D can contact a bottom surface of the source contact layer (48 or 146). In one embodiment, the doped semiconductor well 10D can contact an outer sidewall of the insulating spacer 74 and a bottom surface of the backside contact via structure 76.

In the second embodiment, the backside contact via structure 76 does not directly physically contact the source contact layer 146 because the backside contact via structure 76 is physically separated from the source contact layer 146 by the insulating spacer 74. The backside contact via structure 76 is electrically connected to the source contact layer 146 through the doped semiconductor well 10D located in the semiconductor substrate 10 to permit electric charge carriers, such as electrons, to travel from the backside contact via structure 76 through the doped semiconductor well 10D to the source contact layer 146.

In one embodiment, the three-dimensional memory device can further include a dielectric cap portion 150 underlying the source contact layer (48 or 146), including an identical layer stack as the memory film 50, and having an outer sidewall that is vertically coincident with an outer sidewall of the memory film 50, and a semiconductor cap portion 160 contacting a bottom surface of the annular source region 61, and surrounded by the dielectric cap portion 150, and having a same composition as the vertical semiconductor channel 60.

In one embodiment, the source contact layer (48 or 146) contacts a bottom surface of a bottommost insulating layer 32 within the alternating stack (32, 46). In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region can include stepped surfaces of the alternating stack (32, 46) that continuously extend from a bottommost layer within the alternating stack (32, 46) to a topmost layer within the alternating stack (32, 46). The source contact layer (48 or 146) laterally extends at least as far as a bottommost electrically conductive layer 46 within the alternating stack (32, 46).

Each of the exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate 10 can comprise a silicon substrate. The vertical NAND memory device can comprise an array of monolithic three-dimensional NAND strings over the silicon substrate. At least one memory cell (as embodied as a portion of the memory material layer 54 at a level of an electrically conductive layer 46) in a first device level of the array of monolithic three-dimensional NAND strings can be located over another memory cell (as embodied as another portion of the memory material layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate 10, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion of each of the plurality of semiconductor channels 60 extends substantially perpendicular to a top surface of the substrate 10; and a plurality of charge storage elements (as embodied as portions of the memory material layer 54 at the levels of the electrically conductive layers 46). Each charge storage element can be located adjacent to a respective one of the plurality of semiconductor channels 60.

The exemplary structures of the present disclosure can provide low contact resistance between the annular source regions 61 and the source contact layer (48 or 146) by selecting a suitable height for the sacrificial film 144. Increase in the contact resistance between the annular source regions 61 and the source contact layer (48 or 146) with scaling down of the lateral dimensions of the memory stack structures 55 (due to reduction in the contact area between the annular source regions 61 and the source contact layer (48 or 146)) can be compensated by increasing the thickness of the source contact layer (48 or 146), which can be effected by increasing the thickness of the sacrificial film 144. Thus, the present disclosure provides methods and structures for providing low contact resistance between source regions and source contact via structures (such as the backside contact via structures 76).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a semiconductor substrate;
an alternating stack of insulating layers and electrically conductive layers located over the semiconductor substrate;
a memory stack structure extending through the alternating stack and comprising a memory film and a vertical semiconductor channel;

an annular source region of a first conductivity type contacting a bottom end of the vertical semiconductor channel;

a doped semiconductor well of the first conductivity type located within the semiconductor substrate;

a source contact layer comprising a metal or metal alloy located between the alternating stack and the semiconductor substrate, and contacting an outer sidewall of the annular source region, an annular bottom surface of the memory film, and a top surface of the doped semiconductor well;

a backside contact trench extending through the alternating stack;

an insulating spacer located at a periphery of the backside trench; and a backside contact via structure located within the insulating spacer;

wherein:
the backside contact via structure is separated from the source contact layer by the insulating spacer, such that the backside contact via structure does not directly physically contact the source contact layer; and the backside contact via structure is electrically connected to the source contact layer through the doped semiconductor well located in the semiconductor substrate, wherein the three-dimensional memory device comprises at least one feature selected from:

a first feature that:
the source contact layer comprises a same set of at least one metal or metal alloy materials as the electrically conductive layers, the semiconductor substrate includes a portion having a doping of a second conductivity type that is opposite to the first conductivity type, and the doped semiconductor well contacts a bottom surface of the source contact layer, an outer sidewall of the insulating spacer, and a bottom surface of the backside contact via structure;

a second feature that three-dimensional memory device comprises:
a dielectric cap portion underlying the source contact layer, including an identical layer stack as the memory film, and having an outer sidewall that is vertically coincident with an outer sidewall of the memory film, and a semiconductor cap portion contacting a bottom surface of the annular source region, surrounded by the dielectric cap portion, and having a same composition as the vertical semiconductor channel; and a third feature that the source contact layer comprises:
a metallic liner material including a conductive metal nitride, and a metallic fill material including a metallic material consisting essentially of at least one metal.

2. The three-dimensional memory device of claim 1, wherein the three-dimensional memory device comprises the first feature.

3. The three-dimensional memory device of claim 2, wherein the source contact layer contacts an outer sidewall of the insulating spacer.

4. The three-dimensional memory device of claim 2, wherein the annular source region has the same thickness as the vertical semiconductor channel, and has an inner sidewall that is vertically coincident with an inner sidewall of the vertical semiconductor channel.

5. The three-dimensional memory device of claim 1, wherein the three-dimensional memory device comprises the second feature.

6. The three-dimensional memory device of claim 1, wherein the source contact layer contacts a bottom surface of a bottommost insulating layer within the alternating stack.

7. The three-dimensional memory device of claim 1, wherein the three-dimensional memory device comprises the third feature.

8. The three-dimensional memory device of claim 7, wherein:
the conductive metal nitride comprises titanium nitride;
the at least one metal comprises tungsten; and
the doped semiconductor well comprises a doped single crystal silicon well.

9. The three-dimensional memory device of claim 1, wherein:
the alternating stack comprises a terrace region in which each electrically conductive layer other than a topmost electrically conductive layer within the alternating stack laterally extends farther than any overlying electrically conductive layer within the alternating stack;

the terrace region includes stepped surfaces of the alternating stack that continuously extend from a bottommost layer within the alternating stack to a topmost layer within the alternating stack; and the source contact layer laterally extends at least as far as a bottommost electrically conductive layer within the alternating stack.

10. The three-dimensional memory device of claim 1, wherein:
the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:
a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

11. A method of forming a three-dimensional memory device comprising:
forming a sacrificial film on a semiconductor substrate;

forming an alternating stack of insulating layers and
    sacrificial material layers over the sacrificial film;
forming a memory stack structure through the alternating
    stack, wherein the memory stack structure comprises a
    memory film and a vertical semiconductor channel;
forming a backside trench through the alternating stack;
forming a source level cavity by introducing an etchant or
    a reactant through the backside trench and removing
    the sacrificial film selective to the alternating stack and
    to the semiconductor substrate;
removing an annular portion of the memory film to form
    an annular cavity;
introducing electrical dopants through the source level
    cavity and the annular cavity to form an annular source
    region in a portion of the vertical semiconductor channel and a doped semiconductor well in an upper portion
    of the semiconductor substrate;
forming a source contact layer comprising a metal or
    metal alloy in the source level cavity and directly on the
    annular source region;
replacing the sacrificial material layers with electrically
    conductive layers;
forming an insulating spacer on the source contact layer
    and the electrically conductive layers at a periphery of
    the backside trench; and
forming a backside contact via structure within the insulating spacer such that the backside contact via structure does not directly physically contact the source
    contact layer,
wherein:
the backside contact via structure is physically separated
    from the source contact layer by the insulating spacer;
the backside contact via structure is electrically connected
    to the source contact layer through the doped semiconductor well;
the sacrificial material layers are replaced with the electrically conductive layers by:
    forming backside recesses by removing the sacrificial
        material layers selective to the insulating layers and
        the memory film, and
    depositing at least one conductive material in the
        backside recesses, wherein portions of the deposited
        at least one conductive material in the backside
        recesses constitute the electrically conductive layers;
the step of depositing at least one conductive material in
    the backside recesses and the step of forming the source
    contact layer occur at the same time by depositing the
    at least one conductive material in both the backside
    recesses and in the source level cavity;
the insulating spacer is formed directly on a sidewall of
    the source contact layer; and
the doped semiconductor well contacts a bottom surface
    of the source contact layer, an outer sidewall of the
    insulating spacer, and a bottom surface of the backside
    contact via structure.

12. A method of forming a three-dimensional memory device comprising:
    forming a sacrificial film on a substrate;
    forming an alternating stack of insulating layers and
        sacrificial material layers over the sacrificial film;
    forming a memory stack structure through the alternating
        stack, wherein the memory stack structure comprises a
        memory film and a vertical semiconductor channel;
    forming a backside trench through the alternating stack;
    forming a source level cavity by introducing an etchant or
        a reactant through the backside trench and removing
        the sacrificial film selective to the alternating stack and
        to the substrate;
    removing an annular portion of the memory film to form
        an annular cavity;
    converting a portion of the vertical semiconductor channel into an annular source region by introducing electrical dopants through the source level cavity and the
        annular cavity into the portion of the vertical semiconductor channel;
    epitaxially growing a single crystal semiconductor source
        contact layer in the source level cavity and directly on
        the annular source region; and
    replacing the sacrificial material layers with electrically
        conductive layers.

13. The method of claim 12, further comprising:
    forming an insulating spacer on the source contact layer
        and the electrically conductive layers at a periphery of
        the backside trench; and
    forming a backside contact via structure within the insulating spacer.

14. The method of claim 13, wherein the sacrificial material layers are replaced with the electrically conductive layers by:
    forming backside recesses by removing the sacrificial
        material layers selective to the insulating layers and the
        memory film; and
    depositing at least one conductive material in the backside
        recesses, wherein portions of the deposited at least one
        conductive material in the backside recesses constitute
        the electrically conductive layers.

15. The method of claim 14, wherein the source contact layer is formed prior to formation of the backside recesses.

16. The method of claim 13, wherein:
    the source contact layer is epitaxially grown by a selective
        epitaxy process that deposits a doped single crystalline
        semiconductor material in the source level cavity;
    the doped single crystalline semiconductor material is in
        epitaxial alignment with a single crystalline material in
        the substrate; and
    the backside contact via structure is formed directly on a
        top surface of the source contact layer.

17. The method of claim 12, further comprising patterning the alternating stack to form a terrace region, wherein:
    each sacrificial material layer other than a topmost sacrificial material layer within the alternating stack laterally extends farther than any overlying sacrificial
        material layer within the alternating stack;
    the terrace region includes stepped surfaces of the alternating stack that continuously extend from a bottommost layer within the alternating stack to a topmost
        layer within the alternating stack; and
    the sacrificial film laterally extends at least as far as a
        bottommost sacrificial material layer within the alternating stack after forming the terrace region.

18. The method of claim 12, wherein:
    the three-dimensional memory device comprises a monolithic three-dimensional NAND memory device;
    the electrically conductive layers comprise, or are electrically connected to, a respective word line of the
        monolithic three-dimensional NAND memory device;
    the substrate comprises a silicon substrate;
    the monolithic three-dimensional NAND memory device
        comprises an array of monolithic three-dimensional
        NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

* * * * *